(12) United States Patent
Chan et al.

(10) Patent No.: US 12,009,400 B2
(45) Date of Patent: Jun. 11, 2024

(54) DEVICE PROVIDING MULTIPLE THRESHOLD VOLTAGES AND METHODS OF MAKING THE SAME

(71) Applicant: Taiwan Semiconductor Manufacturing Company, Ltd., Hsin-Chu (TW)

(72) Inventors: Yung-Hsiang Chan, Taichung (TW); Shan-Mei Liao, Hsinchu (TW); Wen-Hung Huang, Hsin-Chu (TW); Jian-Hao Chen, Hsinchu (TW); Kuo-Feng Yu, Hsinchu County (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 321 days.

(21) Appl. No.: 17/464,091

(22) Filed: Sep. 1, 2021

(65) Prior Publication Data
US 2022/0262928 A1    Aug. 18, 2022

Related U.S. Application Data

(60) Provisional application No. 63/149,315, filed on Feb. 14, 2021.

(51) Int. Cl.
*H01L 29/417*   (2006.01)
*H01L 21/8234*  (2006.01)
(Continued)

(52) U.S. Cl.
CPC .......... *H01L 29/41791* (2013.01); *H01L 21/823462* (2013.01); *H01L 21/823857* (2013.01);
(Continued)

(58) Field of Classification Search
CPC ..... H01L 21/823462; H01L 21/823857; H01L 29/0673; H01L 29/42364; H01L 29/42392;
(Continued)

(56) References Cited

U.S. PATENT DOCUMENTS 8,716,841 B1   5/2014   Chang et al.
8,728,332 B2   5/2014   Lin et al.
(Continued)

FOREIGN PATENT DOCUMENTS

JP    201996719 A   6/2019
TW    202004999 A   1/2020
TW    202006824 A   2/2020

*Primary Examiner* — Earl N Taylor
(74) *Attorney, Agent, or Firm* — Haynes and Boone, LLP

(57) ABSTRACT

A method includes forming a dielectric layer on a semiconductor workpiece, forming a first patterned layer of a first dipole material on the dielectric layer, and performing a first thermal drive-in operation at a first temperature to form a diffusion feature in a first portion of the dielectric layer beneath the first patterned layer. The method also includes forming a second patterned layer of a second dipole material, where a first section of the second patterned layer is on the diffusion feature and a second section of the second patterned layer is offset from the diffusion feature. The method further includes performing a second thermal drive-in operation at a second temperature, where the second temperature is less than the first temperature. The method additionally includes forming a gate electrode layer on the dielectric layer.

20 Claims, 28 Drawing Sheets

(51) Int. Cl.
*H01L 21/8238* (2006.01)
*H01L 27/088* (2006.01)
*H01L 29/06* (2006.01)
*H01L 29/423* (2006.01)
*H01L 29/51* (2006.01)
*H01L 29/66* (2006.01)
*H01L 29/775* (2006.01)
*H01L 29/78* (2006.01)
*H01L 29/786* (2006.01)

(52) U.S. Cl.
CPC ...... *H01L 27/0886* (2013.01); *H01L 29/0673* (2013.01); *H01L 29/42364* (2013.01); *H01L 29/42392* (2013.01); *H01L 29/513* (2013.01); *H01L 29/66439* (2013.01); *H01L 29/775* (2013.01); *H01L 29/785* (2013.01); *H01L 29/78696* (2013.01)

(58) Field of Classification Search
CPC .............. H01L 29/513; H01L 29/66439; H01L 29/775; H01L 29/78696
See application file for complete search history.

(56) References Cited

U.S. PATENT DOCUMENTS

| | | |
|---|---|---|
| 8,736,084 B2 | 5/2014 | Cheng et al. |
| 8,762,900 B2 | 6/2014 | Shin et al. |
| 8,764,995 B2 | 7/2014 | Chang et al. |
| 8,767,178 B2 | 7/2014 | Lin et al. |
| 8,796,666 B1 | 8/2014 | Huang et al. |
| 8,802,354 B2 | 8/2014 | Chang et al. |
| 8,812,999 B2 | 8/2014 | Liu et al. |
| 8,822,243 B2 | 9/2014 | Yan et al. |
| 8,828,625 B2 | 9/2014 | Lu et al. |
| 8,837,810 B2 | 9/2014 | Chen et al. |
| 8,841,047 B2 | 9/2014 | Yu et al. |
| 8,841,058 B2 | 9/2014 | Chang |
| 8,850,366 B2 | 9/2014 | Liu et al. |
| 8,877,409 B2 | 11/2014 | Hsu et al. |
| 8,895,234 B2 | 11/2014 | Chang et al. |
| 8,906,595 B2 | 12/2014 | Liu et al. |
| 8,945,803 B2 | 2/2015 | Chen et al. |
| 8,954,899 B2 | 2/2015 | Wu et al. |
| 8,987,142 B2 | 3/2015 | Lee et al. |
| 8,987,689 B2 | 3/2015 | Chen et al. |
| 9,012,132 B2 | 4/2015 | Chang |
| 9,028,915 B2 | 5/2015 | Chang et al. |
| 9,046,789 B2 | 6/2015 | Lin et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,128,384 B2 | 9/2015 | Lin et al. |
| 9,134,633 B2 | 9/2015 | Lin et al. |
| 9,146,469 B2 | 9/2015 | Liu et al. |
| 9,153,478 B2 | 10/2015 | Liu et al. |
| 9,184,054 B1 | 11/2015 | Huang et al. |
| 9,213,234 B2 | 12/2015 | Chang |
| 9,223,220 B2 | 12/2015 | Chang |
| 9,230,867 B2 | 1/2016 | Cheng et al. |
| 9,256,123 B2 | 2/2016 | Shih et al. |
| 9,256,133 B2 | 2/2016 | Chang |
| 9,269,537 B2 | 2/2016 | Tseng et al. |
| 9,287,234 B2 | 3/2016 | Wu et al. |
| 9,304,403 B2 | 4/2016 | Lin et al. |
| 9,305,799 B2 | 4/2016 | Chen et al. |
| 9,336,993 B2 | 5/2016 | Yu |
| 9,367,655 B2 | 6/2016 | Shih et al. |
| 9,367,661 B2 | 6/2016 | Jou et al. |
| 9,390,217 B2 | 7/2016 | Wang et al. |
| 9,404,743 B2 | 8/2016 | Chiu et al. |
| 9,501,601 B2 | 11/2016 | Chang et al. |
| 9,529,268 B2 | 12/2016 | Chang et al. |
| 9,529,959 B2 | 12/2016 | Wang et al. |
| 9,536,759 B2 | 1/2017 | Yang et al. |
| 9,548,303 B2 | 1/2017 | Lee et al. |
| 10,825,736 B1 * | 11/2020 | Zhang .................. H01L 29/775 |
| 2010/0038725 A1 * | 2/2010 | Chudzik ................ H01L 29/49 257/E27.06 |
| 2014/0319616 A1 * | 10/2014 | Baudot ............ H01L 21/28079 257/369 |
| 2015/0104933 A1 * | 4/2015 | Tsai ........................ H05B 6/80 219/745 |
| 2015/0123167 A1 * | 5/2015 | Ji ...................... H01L 21/28202 257/192 |
| 2015/0129973 A1 * | 5/2015 | Ji ......................... H01L 29/513 257/369 |
| 2018/0130704 A1 * | 5/2018 | Li ..................... H01L 21/28052 |
| 2018/0226300 A1 * | 8/2018 | Song .............. H01L 21/823821 |
| 2019/0318967 A1 * | 10/2019 | Chen .............. H01L 21/823821 |
| 2019/0348530 A1 | 11/2019 | Ando et al. |
| 2020/0066864 A1 * | 2/2020 | Ando ............. H01L 21/823487 |
| 2020/0373300 A1 * | 11/2020 | Zhang .............. H01L 21/28158 |
| 2021/0242092 A1 * | 8/2021 | Chen .................. H01L 29/66795 |
| 2021/0272955 A1 * | 9/2021 | More .............. H01L 21/823842 |
| 2021/0375629 A1 * | 12/2021 | Lai ..................... H01L 21/31111 |
| 2021/0391439 A1 * | 12/2021 | Pao ..................... H01L 29/516 |
| 2021/0408001 A1 * | 12/2021 | More .............. H01L 21/823842 |
| 2021/0408229 A1 * | 12/2021 | More .................... H01L 27/092 |
| 2022/0093472 A1 * | 3/2022 | Hsu ................ H01L 21/823857 |
| 2022/0199472 A1 * | 6/2022 | Chao ..................... H01L 29/775 |
| 2022/0199620 A1 * | 6/2022 | Thomas ................. H01L 29/775 |
| 2022/0199796 A1 * | 6/2022 | Zhang ................. H01L 29/0665 |

* cited by examiner

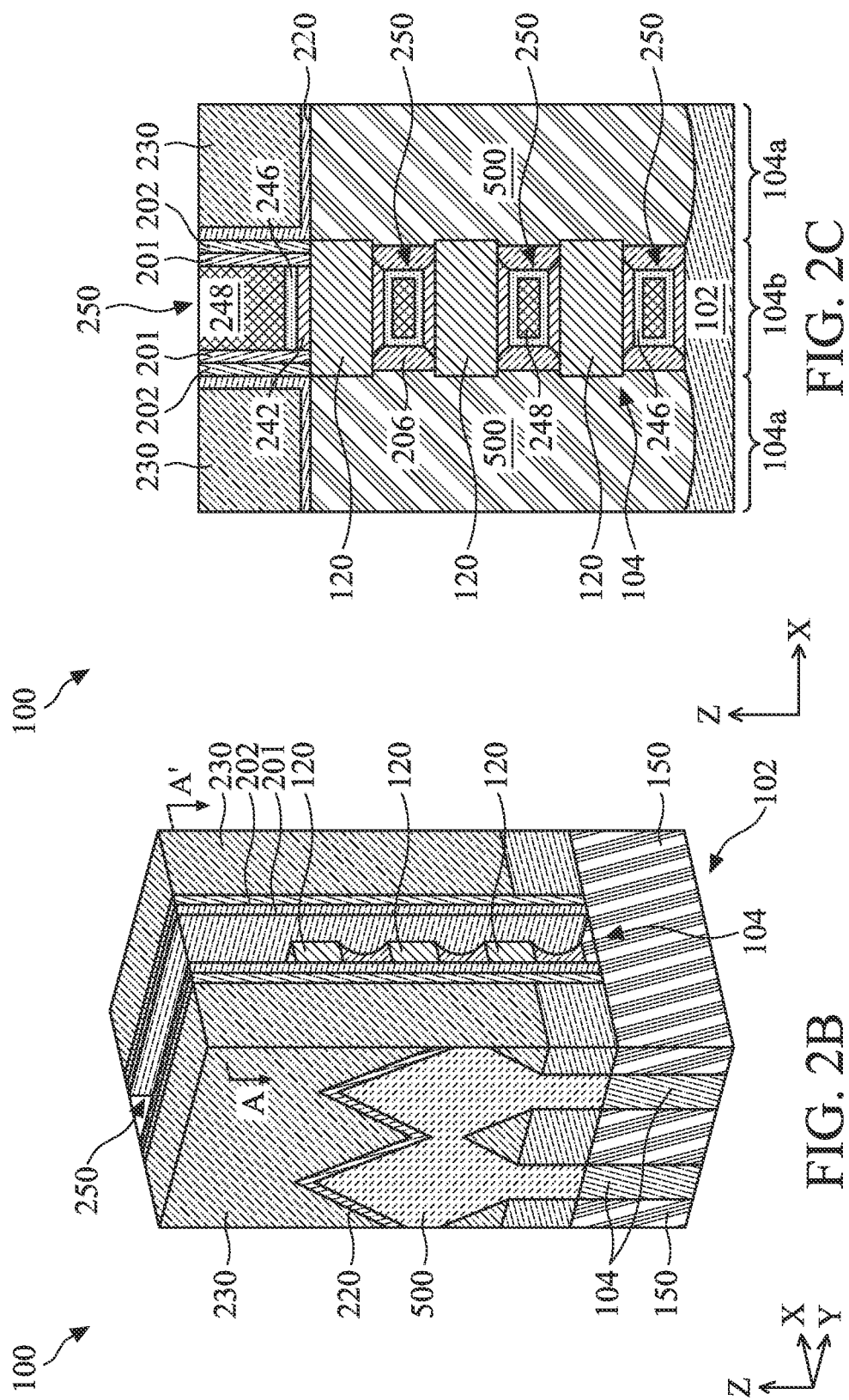

DEVICE PROVIDING MULTIPLE THRESHOLD VOLTAGES AND METHODS OF MAKING THE SAME

PRIORITY DATA

This application claims priority to U.S. Provisional Patent Application No. 63/149,315, filed on Feb. 14, 2021, entitled "Device Providing Multiple Threshold Voltages and Methods of Making the Same", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, nanosheet-based devices have been introduced in an effort to improve gate control by increasing gate-channel coupling, reduce OFF-state current, and reduce short-channel effects (SCEs). Nanosheet-based devices include a plurality of channel layers stacked together to form the transistor channels which are engaged by a gate structure. The nanosheet-based devices are compatible with conventional complementary metal-oxide-semiconductor (CMOS) processes, allowing them to be aggressively scaled down while maintaining gate control and mitigating SCEs. However, due to the complex device structures and reduced spacing between features, it may be challenging to accomplish certain functions, such as to provide multiple threshold voltages, without incurring penalty to other performance characteristics. Therefore, although conventional technologies have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a three-dimensional (3D) perspective view of a nanosheet-based transistor of an embodiment of a device of the present disclosure constructed according to some embodiments of the present disclosure.

FIG. 2C is a cross-sectional view of the nanosheet-based transistor of FIG. 2B along the line A-A' according to some embodiments of the present disclosure.

DETAILED DESCRIPTION

Figure 1:
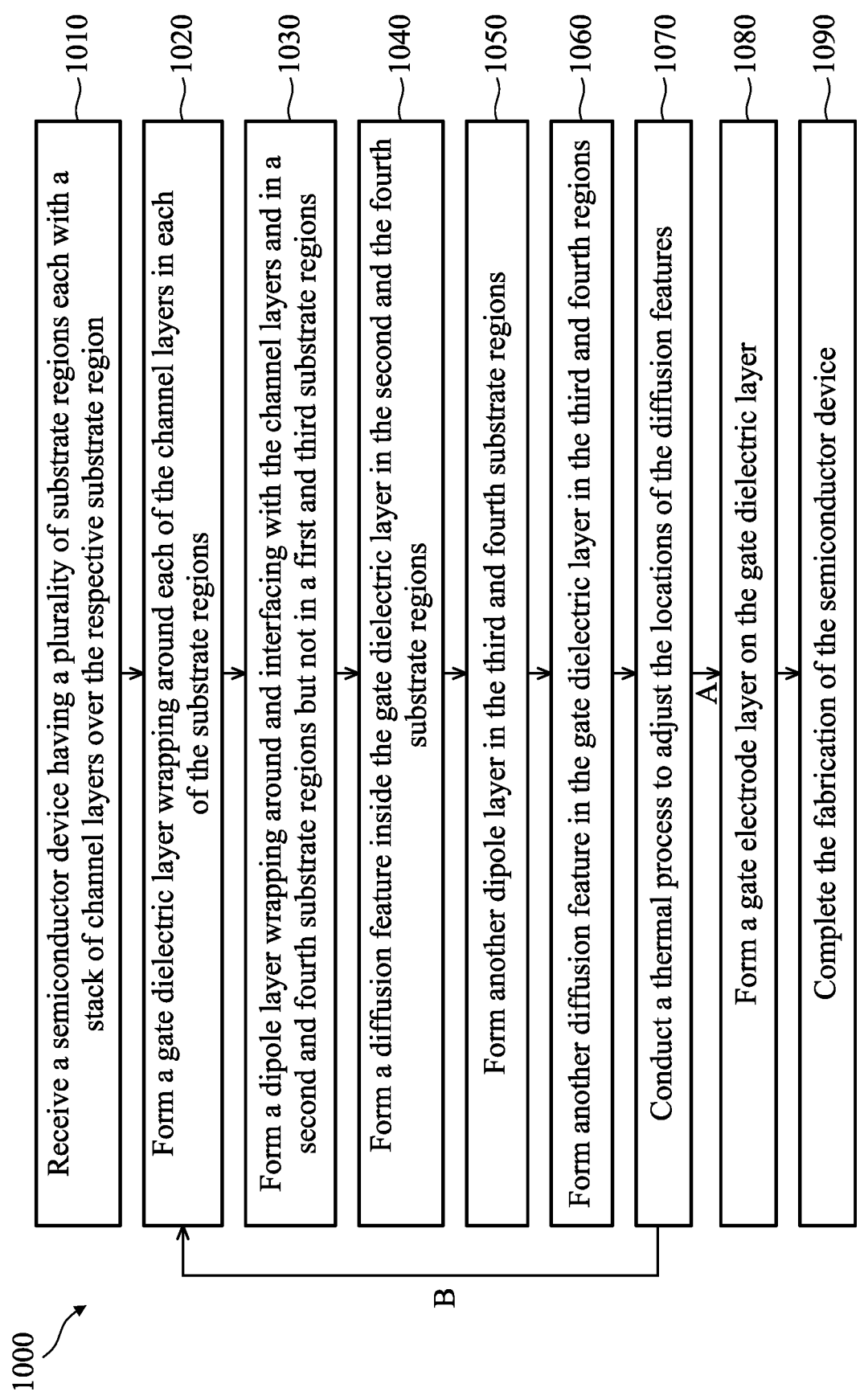
FIGS. 1 and 14 are flow charts illustrating methods for fabricating devices of the present disclosure according to some embodiments of the present disclosure.

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to ICs and semiconductor devices and methods of forming the same. More particularly, the present disclosure is related to semiconductor devices having multiple threshold voltages (Vt) (hereinafter referred to as multi-Vt devices). As the advanced technology nodes continue to scale down, it has become increasingly challenging to develop such multi-Vt devices. Typically, various additional material layers may be required in order to engineer the devices to provide multiple threshold voltages. These material layers occupy certain spaces (and/or volumes) on the semiconductor chips which impedes the effort of scale-down. In some examples, the devices may not have sufficient space to accommodate such additional material layers. For example, nanosheet-based devices (sometimes referred to as gate-all-around (GAA) devices, multi-bridge-channel (MBC) devices, or other similar names) include a plurality of channel layers stacked one on top of another. The gate stacks are formed in the very narrow spacing between vertically adjacent channel layers, where additional material layers are sometimes impractical to reliably form. Moreover, volumes of these additional material layers may further adversely affect device performances, such as leading to a penalty to the channel resistance ($R_{ch}$). Accordingly, the present disclosure provides processes and methods that allows formation of multi-Vt devices without the volume requirement. The devices presented herein may be a complementary metal-oxide-semiconductor (CMOS) device, a p-type metal-oxide-semiconductor (PMOS) device, or an n-type metal-oxide-semiconductor (NMOS) device. One of ordinary skill may recognize other examples of semiconductor devices that may benefit from aspects of the present disclosure. Moreover, although the disclosure uses nanosheet-based devices as an example, one of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from aspects of the present disclosure.

Figure 2A:
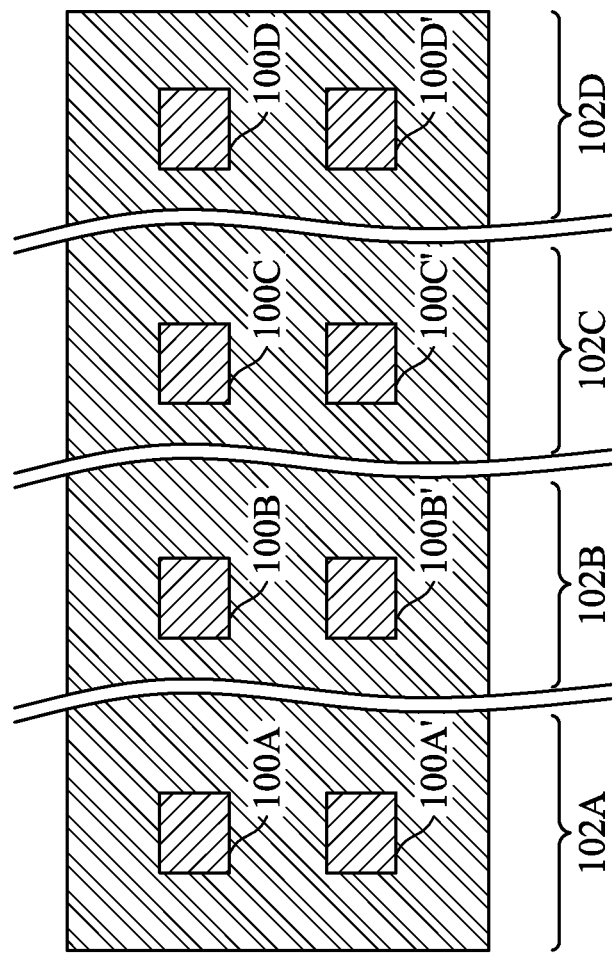
FIGS. 2A and 15 are plan views of embodiments of devices of the present disclosure according to some embodiments of the present disclosure.

FIG. 1 is a flow chart of an embodiment of a method 1000 of the present disclosure for preparing an embodiment of a multi-Vt device 10 (or simply device 10) of the present disclosure. FIG. 2A is a plan view of the device 10 according to an embodiment of the present disclosure. FIG. 2B is a three-dimensional (3D) perspective view of a nanosheet-based transistor 100, which is representative of a component of the device 10 of FIG. 2A according to some embodiments of the present disclosure. FIG. 2C is a cross-sectional view of the nanosheet-based transistor 100 of FIG. 2B along the line A-A' according to some embodiments of the present disclosure. FIGS. 3-12 are cross sectional views or expanded cross-sectional views of the device 10 (or portions thereof) at various fabrication stages according to embodiments of the present disclosure.

Referring to block 1010 of FIG. 1 and to FIGS. 2A-2C, an example nanosheet-based multi-Vt device 10 is received. The device 10 includes a plurality of nanosheet-based transistors (or simply transistors), such as transistors 100A-100D and 100A'-100D'. In the depicted embodiments, the transistors 100A and 100A' are formed in a substrate region 102A of a semiconductor substrate 102; the transistors 100B and 100B' are formed are formed in a substrate region 102B of a semiconductor substrate 102; the transistors 100C and 100C' are formed are formed in a substrate region 102C of a semiconductor substrate 102; and the transistors 100D and 100D' are formed are formed in a substrate region 102D of a semiconductor substrate 102. Moreover, in the depicted embodiments, transistors 100A-100D may be configured as n-type transistors, while the transistors 100A'-100D' may be configured as p-type transistors. In some embodiments, the transistors 100A-100D each have a different threshold voltage; and the transistors 100A'-100D' each have a different threshold voltage. Accordingly, the device 10 provides n-type transistors and p-type transistors each offering four (4) different threshold voltages. As described later, these total of eight (8) threshold voltages may be achieved by configuring gate dielectric layers differently with respect to dipole elements. The transistors 100A-100D and 100A'-100D' may include similar or different device structures. In the depicted embodiments, transistors 100A-100D and 100A'-100D' are each nanosheet-based transistors and have similar device structures, such as the device structure of transistor 100 illustrated in FIGS. 2B and 2C. FIGS. 2A-2C have been abbreviated to provide a general picture of the device 10, and do not include all details. For example, shapes, sizes, and relative positions of the transistors shown in FIGS. 2A-2C have been simplified and/or conceptualized, and are not intended to be limiting. Additional details are described in conjunction with subsequent figures.

Referring to FIGS. 2B and 2C, nanosheet-based transistor 100 (or simply transistor 100) may be representative of one or more of the transistors 100A-100D and 100A'-100D' of FIG. 2A. In other words, FIGS. 2B and 2C illustrates a portion of FIG. 2A. As illustrated, the transistor 100 includes a semiconductor substrate 102 (or simply substrate 102). The substrate 102 contains a semiconductor material, such as bulk silicon (Si), germanium (Ge), silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 102 may also include a semiconductor-on-insulator substrate, such as Si-on-insulator (SOI), SiGe-on-insulator (SGOI), Ge-on-insulator (GOI) substrates. Fin structures (or fins) 104 are formed over the substrate 102, each extending lengthwise horizontally in an X-direction and separated from each other horizontally in a Y-direction. The X-direction and the Y-direction are perpendicular to each other, and the Z-direction is orthogonal (or normal) to a horizontal XY plane defined by the X-direction and the Y-direction. The substrate 102 may have its top surface parallel to the XY plane. As described above, the substrate 102 include substrate regions 102A-102D.

The fin structures 104 each have a source region 104a and a drain region 104a disposed along the X-direction. The source region 104a and the drain region 104a are collectively referred to as the source/drain regions 104a. Epitaxial source/drain features 500 are formed in or on the source/drain regions 104a of the fin structure 104. In some embodiments, the epitaxial source/drain features 500 are configured to be part of the PMOS transistor. Accordingly, the epitaxial source/drain features 500 may include any suitable p-type semiconductor materials, such as Si, SiGe, Ge, SiGeC, or combinations thereof. In some embodiments, the epitaxial source/drain features 500 are configured to be part of the NMOS transistor. Accordingly, the epitaxial source/drain features 500 may include any suitable n-type semiconductor materials, such as Si. The epitaxial source/drain features 500 may further be doped in-situ or ex-situ. For example, the epitaxially grown SiGe source/drain features of a PMOS may be doped with boron (B) to form Si:Ge:B source/drain features; and the epitaxially grown Si source/drain features of an NMOS may be doped with carbon to form silicon:carbon (Si:C) source/drain features, doped with phosphorous to form silicon:phosphorous (Si:P) source/drain features, or both carbon and phosphorous to form silicon carbon phosphorous (Si:C:P) source/drain features. Multiple processes, including etching and growth processes (such as epitaxial processes), may be employed to grow the epitaxial source/drain features 500. One or more annealing processes may be performed to activate the dopants in the epitaxial source/drain features 500. In some embodiments, the epitaxial source/drain features 500 may merge together, for example, along the Y-direction between adjacent fin structures 104 to provide a larger lateral width than an individual epitaxial source/drain feature.

The fin structures 104 each further have a channel region 104b disposed between and connecting the source/drain regions 104a. The fin structures 104 each include a stack of channel layers 120 (also interchangeably referred to as "semiconductor layers 120," "suspended semiconductor layers 120," or "suspended channel layers 120"). The stack of channel layers 120 occupy the channel region 104b of the fin structures 104 and extends vertically (e.g. along the Z-direction) from the substrate 102. Each of the channel layers 120 connects a pair of epitaxial source/drain features 500. The channel layers 120 may each be in one of many different shapes, such as wire (or nanowire), sheet (or nanosheet), bar (or nano-bar), and/or other suitable shapes, and may be spaced away from each other. In the depicted embodiments, there are three channel layers 120 in the stack. However, there may be any appropriate number of layers in the stack, such as 2 to 10 layers. In some embodiments, the channel layers 120 are on the nanometer scale (e.g. having at least one dimension that is about 1 nm to about 100 nm). Accordingly, the channel layers 120 are referred to as nanostructures, and the transistors are referred to as nanostructure (or nanosheet) based transistors.

In some embodiments, the fin structures 104 may be formed by first forming a stack of layers over the substrate 102. The stack of layers may include semiconductor layers 110 and the semiconductor layers 120 alternating with each other. The material compositions of the semiconductor layers 110 and semiconductor layers 120 are configured such that they have an etching selectivity in a subsequent etching process. For example, in some embodiments, the semiconductor layers 110 contain silicon germanium (SiGe), while the semiconductor layers 120 contain silicon (Si). The stacks of layers (and in some embodiments, the substrate portion therebeneath) are then collectively patterned into the fin structures 104 such that the fin structure 104 each extend lengthwise along the X-direction. The patterning may be by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The fin structures 104 may have lateral widths along the Y-direction that are the same between each other or different from each other.

The semiconductor layers 110 are subsequently removed, thus are also referred to as the sacrificial semiconductor layers 110. Meanwhile, the patterned semiconductor layers 120 later serve as the channel for transistors, thus are also referred to as the channel layers 120. The channel layers 120 may each engage with a single gate structure 250. The gate structure 250 includes gate dielectric layer 246 and gate electrode layer 248. In the depicted embodiments, the gate structure 250 further includes interfacial layer 242. However, in some other embodiments, the interfacial layer 242 may be omitted. Note that the gate structure 250 is illustrated as a transparent feature in FIG. 2B in order to illustrate the features (such as the channel layers 120) that the gate structure 250 covers. The gate structures 250 may be configured to extend lengthwise parallel to each other, for example, each along the Y-direction. In some embodiments, the gate structures 250 each wrap around the top surface and side surfaces of each of the fin structures 104. In some embodiments, as described later, the gate structure 250 is first formed with a dummy gate stack of a different material, such as polysilicon, which is subsequently replaced with the gate dielectric layer 246 and the gate electrode layer 248 (and in some embodiments, the interfacial layer 242). The dummy gate stacks 240 may be formed by a procedure including deposition, lithography, patterning, and etching processes. The deposition processes may include chemical vapor deposition (CVD) processes, atomic layer deposition (ALD) processes, physical vapor depositions (PVD), other suitable methods, or combinations thereof. The gate structure 250 further includes gate spacers. Gate spacers may include a single layer or a multi-layer structure. For example, in the depicted embodiment, a gate spacer layer 201 is formed over the top surface of the device, and a gate spacer layer 202 is formed over the gate spacer layer 201. The gate spacer layers 201 and 202 may each include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof.

The transistor 100 further includes isolation features 150 within or over the substrate 102, separating adjacent fin structures 104 from each other. The isolation features 150 may be shallow trench isolation (STI) features. In some examples, the formation of the isolation features 150 includes etching trenches into the substrate 102 between the active regions (the regions in which the fin structures are formed) and filling the trenches with one or more dielectric materials such as silicon oxide, silicon nitride, silicon oxynitride, other suitable materials, or combinations thereof. Any appropriate methods, such as a CVD process, an ALD process, a PVD process, a plasma-enhanced CVD (PECVD) process, a plasma-enhanced ALD (PEALD) process, and/or combinations thereof may be used for depositing the isolation features 150. The isolation features 150 may have a multi-layer structure such as a thermal oxide liner layer over the substrate 102 and a filling layer (e.g., silicon nitride or silicon oxide) over the thermal oxide liner layer. Alternatively, the isolation features 150 may be formed using any other isolation technologies. As illustrated in FIG. 2B, the fin structure 104 is located above the top surface of the isolation features 150. In the depicted embodiment, the transistor 100 further includes inner spacers 206 between the gate structures 250 and the source/drain features 500; contact etch stop layers 220 over the epitaxial source/drain features 500; and interlayer dielectric (ILD) layer 230 over the epitaxial source/drain features 500 and over the contact etch stop layers 220. FIGS. 2B and 2C have been abbreviated to provide a general picture of the transistor 100, and do not include all details. Additional details of the gate structures 250 are described in conjunction with subsequent figures.

Figure 3:
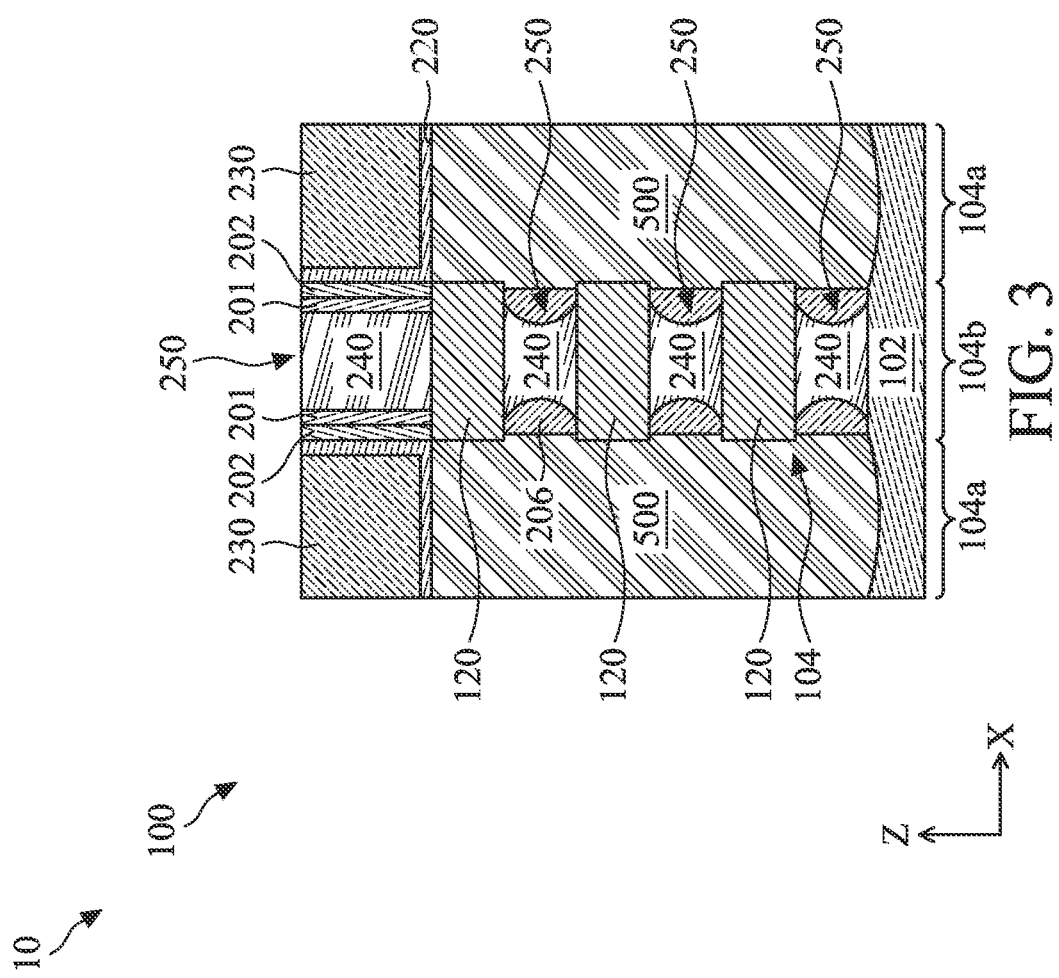
FIGS. 3, 4, 5, 6, 7, 8, 9, 10, 11, 12, 16, 17, 18, 19, 20, and 21 are cross-sectional views of an embodiment of a device of the present disclosure, or portions thereof, constructed at various fabrication stages according to some embodiments of the present disclosure.

As described above, the transistor 100 is formed by replacing a dummy gate stack of the gate structure 250 with the gate dielectric layer 246 and the gate electrode layer 248 (and in some embodiments, the interfacial layer 242). The disclosure below describes details for forming the gate dielectric layer 246. Referring back to block 1010 of FIG. 1 and to FIG. 3, a workpiece for the device 10 (or simply workpiece 10) is received. FIG. 3 illustrates only a portion of the workpiece 10, which is subsequently processed into the transistors 100 of FIGS. 2B and 2C (e.g. one of the transistors 100A-100D and 100A'-100D'). In other words, FIG. 3 illustrates the transistor 100 at an earlier processing stage than that in FIGS. 2B and 2C. More specifically, the transistor 100 at this processing stage includes all features described above with respect to FIGS. 2B and 2C with the exception that the gate structure 250 includes the dummy gate stack 240 rather than the gate dielectric layer 246, the gate electrode layer 248 or the interfacial layer 242. The dummy gate stack 240 may include any suitable materials, such as polysilicon. In some embodiments, the dummy gate stack 240 may include a multi-layer structure. For example, in some implementations, dummy gate stack may include a dummy gate dielectric layer and a dummy gate electrode layer.

Figure 4:
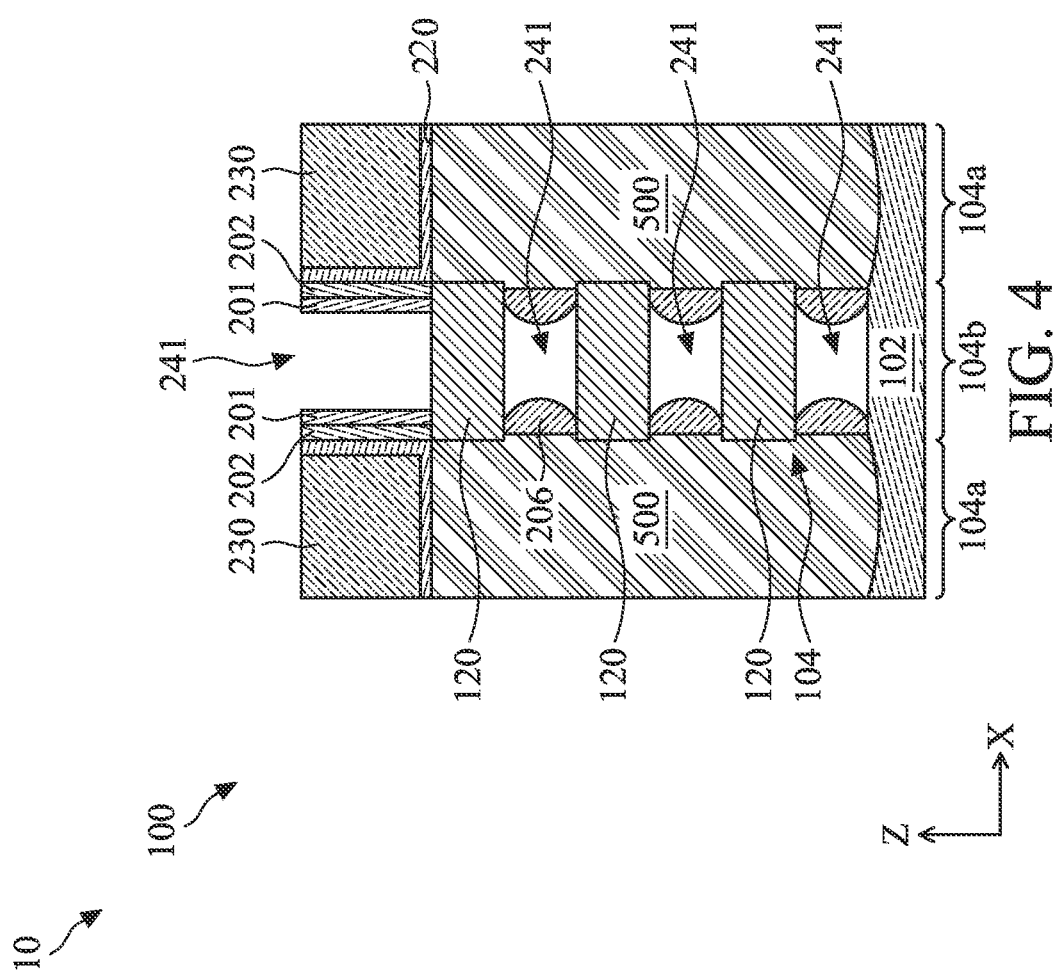

Referring to FIG. 4, the dummy gate stack 240 is selectively removed from the gate structure 250 to form openings. The etching process may be a dry etching process, a wet etching process, or combinations thereof. The etching process can be tuned, such that dummy gate stack 240 is removed without (or only minimally) etching other features of transistor 100. Furthermore, following the removal of the dummy gate stack 240, which exposes sidewall surfaces of the fin structures 104, the remaining portions of the sacrificial semiconductor layers 110 are selectively removed to form additional openings. These openings collectively form gate trenches 241. The gate trenches 241 expose portions of the channel layers 120 in 3600 and further exposes the top surface of the substrate 102.

Figure 5:
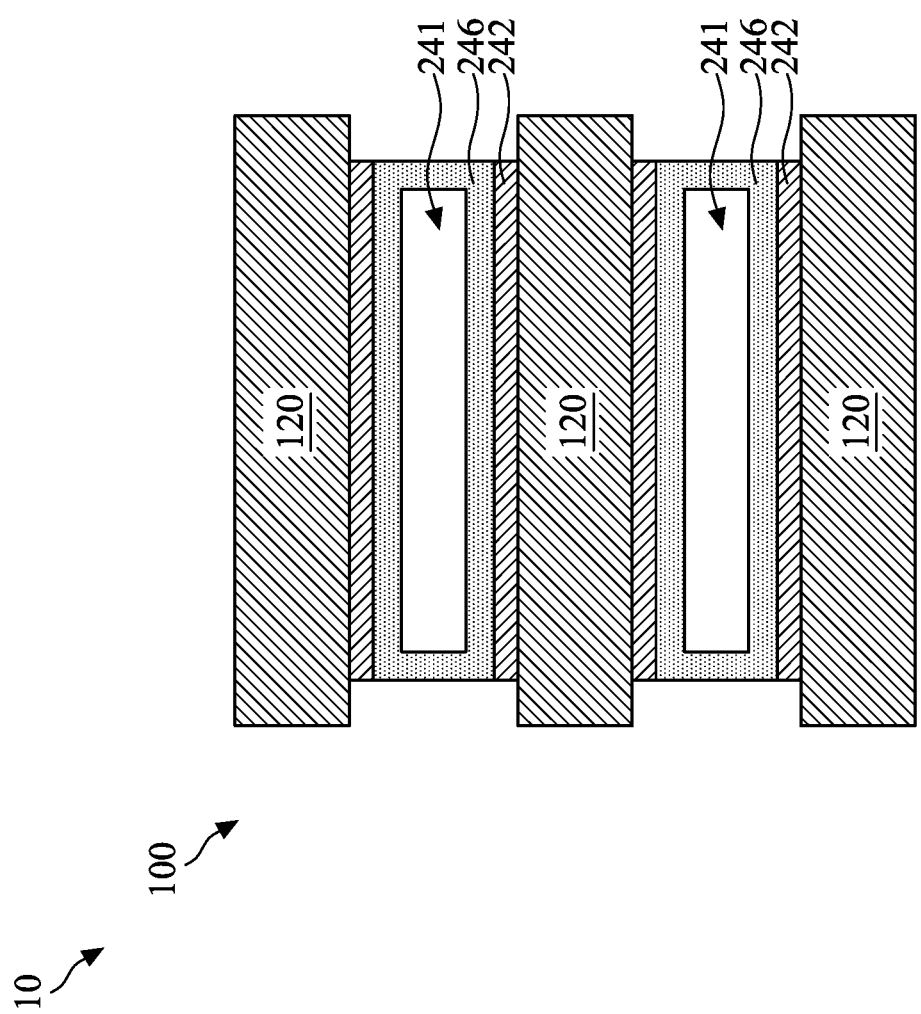

FIG. 5 illustrates an expanded view of the transistor 100, particularly, a portion of the gate trench 241 of the transistor 100. Referring to FIG. 5, the method 1000 proceeds to form an interfacial layer 242 in the gate trenches 241 and on the channel layers 120. In some embodiments, interfacial layers 242 are formed on the exposed surfaces of the channel layers 120. In some embodiments, the interfacial layers 242 improves the adhesion between the subsequently formed gate dielectric layer 246 and the channel layers 120. In some embodiments, the interfacial layer 242 has a thickness in a range of about 5 Å to about 15 Å. In embodiments, the interfacial layer 242 includes a dielectric material, such as $SiO_2$, HfSiO, SiON, other silicon-containing dielectric material, other suitable dielectric material, or combinations thereof. The interfacial layer 242 is formed by any suitable processes, such as thermal oxidation, chemical oxidation, ALD, CVD, other suitable process, or combinations thereof.

Referring to block 1020 of FIG. 1 and to FIG. 5, a gate dielectric layer 246 is formed on the interfacial layer 242, such as directly on and contacting (e.g. interfacing with) the interfacial layer 242. Moreover, the gate dielectric layer 246 may be further formed over other surfaces exposed in the gate trenches 241. The gate dielectric layer 246 may include a high-k dielectric material, such as $HfO_2$, HfSiO, $HfSiO_4$, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), hafnium dioxide-alumina ($HfO_2$—$Al_2O_3$) alloy, other suitable high-k dielectric material, or combinations thereof. The gate dielectric layer 246 is formed by any of the processes described herein, such as ALD, CVD, PVD, oxidation-based deposition process, other suitable process, or combinations thereof. For example, a gate dielectric layer 246 may be conformally deposited over the interfacial layers 242 by an ALD process, such that gate dielectric layer 246 has a substantially uniform thickness and partially fills the gate trenches 241. The gate dielectric layer 246 may be disposed on sidewall surfaces of the inner spacers 206, as well as surrounding the channel layers 120. In some embodiments, the gate dielectric layer 246 has a thickness of about 1 nm to about 3 nm. The gate dielectric layer 246 is formed surrounding the exposed portions of the channel layers 120 and reduces the size of the gate trenches 241. The gate dielectric layer 246 separates the channel layers 120 and the gate electrode layer subsequently formed and is critical to determining threshold voltage of the transistor.

Figure 6:
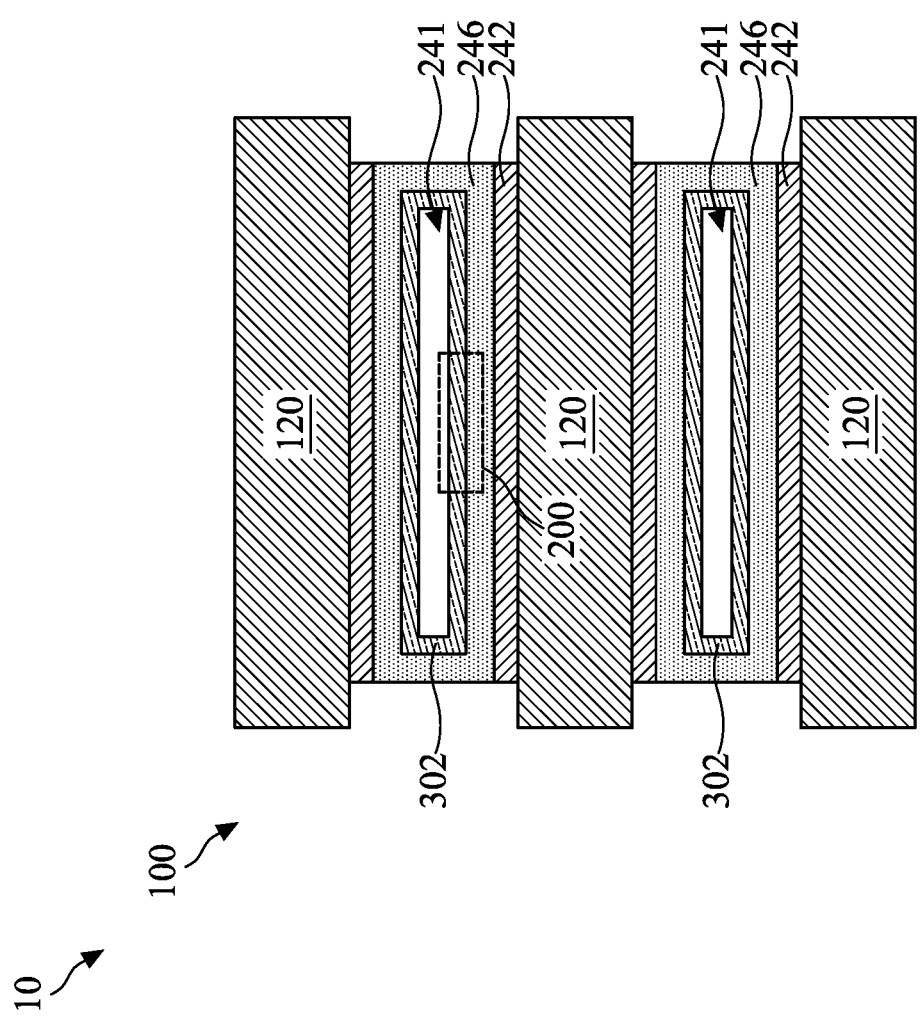

Referring to block 1030 of FIG. 1 and to FIG. 6, a dipole layer 302 is deposited into the gate trenches 241, or some of the gate trenches 241 as described later. As described above, the gate trenches 241 each surround portions of the channel layers 120 (e.g. the portions wrapped by the gate dielectric layer 246) in 360° and also over a portion of the topmost channel layer 120 and a portion of the substrate 102. Accordingly, the dipole layer 302 is formed on and surrounding the gate dielectric layer 246 such that the dipole layer 302 directly contacts the exposed surfaces of the gate dielectric layer 246. The dipole layer 302 may be deposited by ALD, CVD, PVD, thermal oxidation, or other suitable methods, and may be deposited at a temperate in a range from about 100° C. to about 450° C. at a pressure in a range from about 1 torr to about 100 torr. The dipole layer 302 may include any suitable materials. In some embodiments, the dipole layer 302 may include an n-dipole material or a precursor to an n-dipole material. The n-dipole material may include germanium oxide ($GeO_2$), yttrium oxide ($Y_2O_3$), lanthanum oxide ($La_2O_3$), strontium oxide (SrO), other suitable n-dipole materials, or combinations thereof. In some embodiments, the dipole layer 302 may include a p-dipole material or a precursor to a p-dipole material. The p-dipole material may include aluminum oxide ($Al_2O_3$), gallium oxide ($Ga_2O_3$), magnesium oxide (MgO), hafnium oxide ($HfO_2$), titanium oxide ($TiO_2$), zirconium oxide ($ZrO_2$), zinc oxide (ZnO), other suitable p-dipole materials, or combinations thereof. As illustrated in FIG. 6, the dipole layer 302 is spaced away from the channel layers 120 and from the gate dielectric layer 246 at this processing stage. As will be discussed, the dipole materials of the dipole layer 302 will be, in a subsequent step, thermally driven into the respective gate dielectric layer 246 such that they distribute across the gate dielectric layer 246 and around the interface between the gate dielectric layer 246 and the interfacial layer 242. Accordingly, the dipole materials of the dipole layer 302 may thus be distributed closer or approach surfaces of the channel layers 120. The n-dipole material configured this way in an NMOS serves to reduce the threshold voltage of the NMOS; while the n-dipole material configured this way in a PMOS serves to increase the threshold voltage of the PMOS. Similarly, the p-dipole material configured this way in a PMOS serves to reduce the threshold voltage of the PMOS; while the p-dipole material configured this way in an NMOS serves to increase the threshold voltage of the NMOS. Moreover, the amount and distribution of these dipole materials further affect the magnitude of change in the threshold voltages. Accordingly, threshold voltages of the transistors may be fine-tuned by simply engineering the presence or absence, chemical identity, as well as the distributions of the dipole materials within the gate dielectric layer 246.

In some embodiments, the material of the dipole layer 302 can be designed based on the desired magnitude (or amount) of threshold voltage tuning. For example, using materials such as $La_2O_3$, $Y_2O_3$, or $TiO_2$, the threshold voltage of the transistor 100 may be adjusted up (for p-type transistor) or down (for n-type transistor) in a range of about 20 mV to about 450 mV. Moreover, the thickness of the dipole layer 302 may be further adjusted based on the desired magnitude of threshold voltage tuning. In some embodiment, a thicker dipole layer 302 generally allows (all things else being equal) more dipole material to enter the gate dielectric layer 246, and leads to a greater change in the transistor's threshold voltage. In some embodiments, the dipole layer 302 may be deposited to a substantially uniform thickness in a range about 0.5 Å to about 10 Å in various embodiments, such as about 3 Å to about 5 Å. If the thickness is too small (such as less than 0.5 Å), the dipole layer 302 may be too weak for Vt tuning in some instances. If the thickness is too big (such as greater than 10 Å), the dipole layer 302 may be too strong for Vt tuning and may create side effects such as degraded mobility in the channel layers 120.

Figure 7:
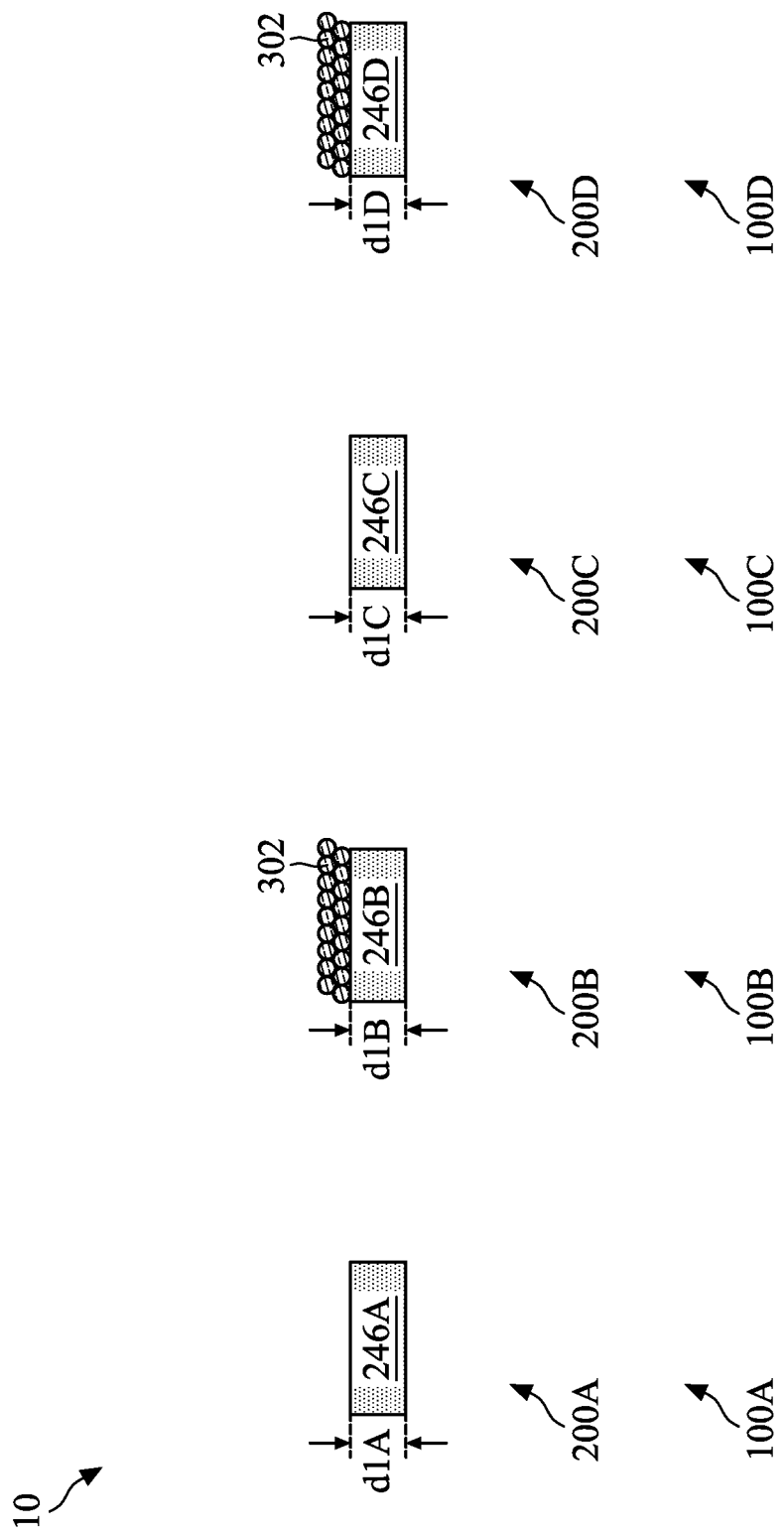

Moreover, as described above, the device 10 includes a plurality of NMOS transistors and PMOS transistors. Each transistor may have device structures that resemble that of the transistor 100 described above with respect to FIGS. 2B-2C, and 3-6, with the exception that only a subset of the transistors include the dipole layer 302. Accordingly, each transistor includes a respective gate trench 241 and may, where appropriate, receive the deposition of a respective portion of the dipole layer 302 on the respective portion of the gate dielectric layer. In other words, each of the transistors 100A-100D and 100A'-100D' may include a portion 200A-200D (corresponding to the portion 200 of FIG. 6) including the gate dielectric layer 246 and the remaining portion of the gate trench 241. Moreover, some of the portions 200A-200D may include the dipole layer 302, as described in detail later. In that regard, FIG. 7 illustrates portions 200A-200D of the NMOS transistors 100A-100D for the purpose of clearly illustrating aspects of the embodiments. While the portions 200A-200D are depicted to be discontinuous from each other, it is understood that portions thereof may instead be connected to one or another. Moreover, although they are depicted side-by-side in a particular sequence, it is understood that any alternative relative position are contemplated by the present disclosure. Furthermore, although not explicitly illustrated below, transistors 100A'-100D' may include gate dielectric portions and dipole layer 302 similar to those NMOS transistors 100A-100D, and undergo similar processing steps.

Referring to FIG. 7, each of the portions 200A-200D include a respective portion of the gate dielectric layer 246, referred to as the gate dielectric portions 246A-246D, respectively. The dipole layer 302 is shown here as a collection of circles representing chemical compositions of the dipole layer 302 of FIG. 6. The number of the circles do not necessarily represent the concentrations or amounts of the chemical compositions. Although not explicitly depicted in FIG. 7, the dipole layer 302 is further formed on sidewall surfaces and bottom surfaces of the gate dielectric portions 246A-246D, similar to the dipole layer 302 formed on sidewall surfaces and bottom surfaces of the gate dielectric layer 246 of FIG. 6. In the depicted embodiments, the dipole layer 302 is formed on surfaces of a subset, but not all, of the gate dielectric portions 246A-246D. At this processing stage, the gate dielectric portions 246B and 246D may each have a thickness d1B and d1D, which may be about 1 nm to about 3 nm. In some embodiments, the thickness d1B and d1D may be similar to the thickness d1A and d1C of the respective gate dielectric portions 246A and 246C. If the thickness d1A-d1D is too small, such as less than about 1 nm, tunneling may increase drastically across the gate dielectric portions 246A-246D thereby causing leakage. If the thickness d1A-d1D is too large, such as greater than about 3 nm, the gate capacitances may not be optimized.

Figure 8:
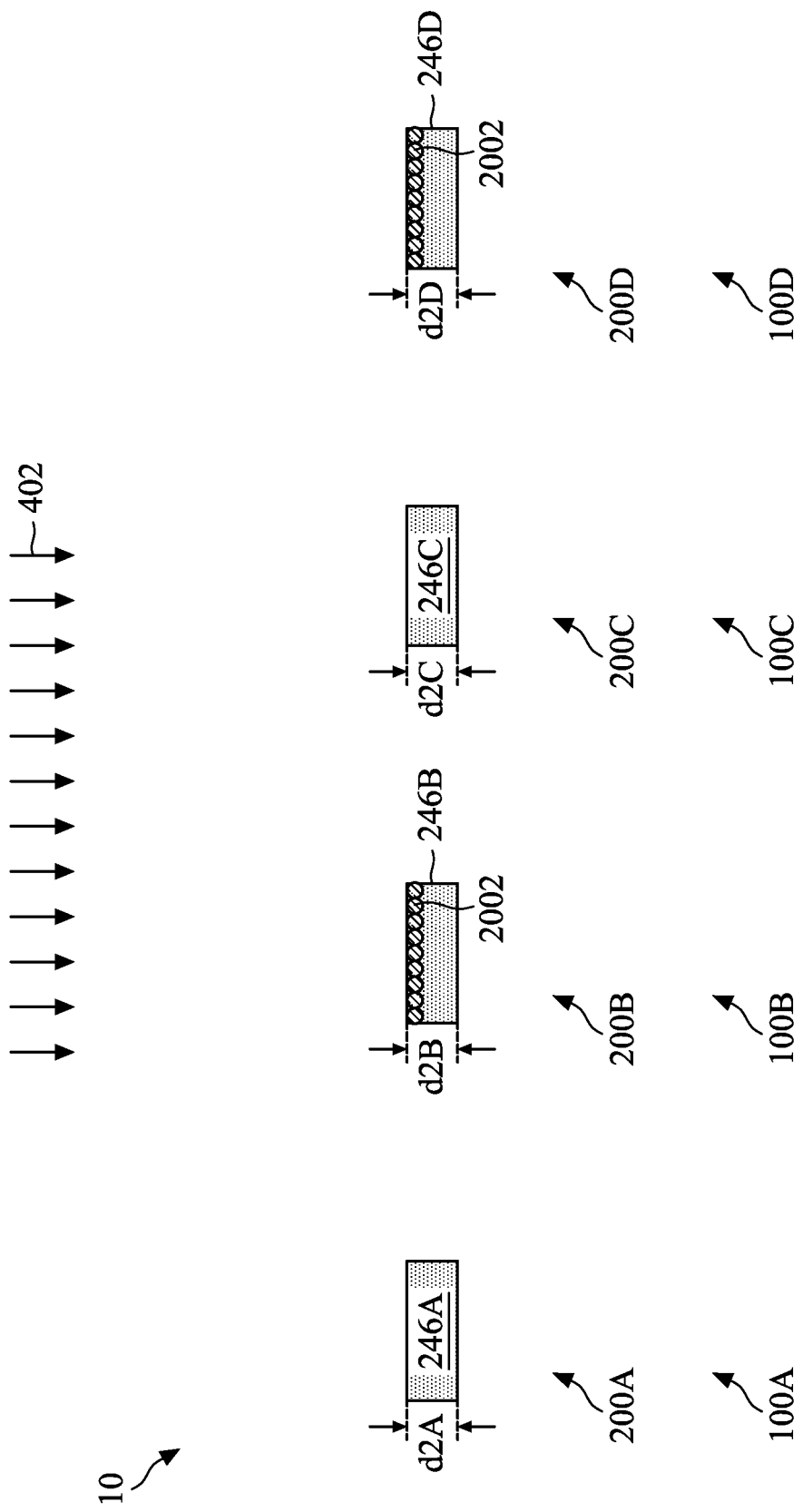

Referring to block 1040 of FIG. 1 and to FIG. 8, a process 402 is conducted to form a diffusion feature inside the gate dielectric layer 246 in regions configured for a subset of the transistors 100A-100D. In some embodiments, the process 402 includes a thermal drive-in operation (alternatively referred to as an annealing process). In some embodiments, the dipole materials of the dipole layer 302 (e.g. dipole material $La_2O_3$), or dipole elements of the dipole layer 302 (e.g. the La and O elements of the dipole layer 302 having the dipole material $La_2O_3$) are at least partially driven into the gate dielectric layer 246. For example, the thermal drive-in operation provides thermal energy to the workpiece 10 such that the mobility of the dipole material substantially increases, and the dipole elements diffuse into areas they interface with (such as into the gate dielectric portions 246B and 246D interfacing with the dipole layer 302). In an embodiment, the thermal drive-in operation is a soak anneal process at a temperature in a range from about 600° C. to about 1,000° C., such as about 700° C. to about 800° C., with $O_2$, $N_2$, or a mixture of $O_2$ and $N_2$ ambient. In another embodiment, the thermal drive-in operation is a furnace anneal process at a temperature in a range from about 300° C. to about 600° C. with $O_2$, $N_2$, or a mixture of $O_2$ and $N_2$ ambient for about 1 second to about 30 minutes. In yet another embodiment, the thermal drive-in operation is a spike anneal process. In still another embodiment, the thermal drive-in operation is a laser anneal process or a microwave anneal process at a temperature in a range from about 800° C. to about 1,200° C. with $O_2$, $N_2$, $NH_3$, $H_2$, or a mixture thereof for about 1 millisecond to about 10 seconds. The above ranges of temperature are selected such that the thermal drive-in operation does not adversely affect the existing structures and features of the device 10 and is yet sufficient to cause the dipole elements to migrate (or diffuse) from the dipole layer 302 into the gate dielectric layer 246 thereunder. In some embodiments, the dipole elements (e.g. La and O) diffuse into the gate dielectric layer 246 while maintaining their stoichiometric ratio as that in the dipole layer 302 (e.g. [La]:[O] at 2:3 for $La_2O_3$). In other words, the stoichiometric ratio of the dipole elements in the gate dielectric layer 246 (e.g. the ratio of the increase in La atomic concentration to the increase in O atomic concentration) is substantially the same as that of the dipole elements in the dipole layer 302. In some other embodiments, the dipole elements diffuse into the gate dielectric layer 246 without maintaining the same stoichiometric ratio. Accordingly, the ratio of the dipole elements within the gate dielectric layer 246 (e.g. the ratio of the increase in La atomic concentration to the increase in O atomic concentration) may differ from that of the dipole layer 302. As described later in detail, the chemical identity, the amount (or concentration), and the distributions of the dipole elements may be further adjusted to achieve the desired threshold voltage.

The thermal drive-in operation of process 402 causes a portion of the dipole materials of the layer 302 to diffuse into the gate dielectric portions 246B and 246D in a specific manner. As a result, the gate dielectric portions 246B and 246D each include a specific dipole material composition 2002. Accordingly, the gate dielectric portions 246B and 246D may be said to include a diffusion feature of the dipole material composition 2002 (or simply diffusion feature 2002). As will be discussed in more details below, the dipole material composition 2002 is configured differently from dipole material compositions in other gate dielectric portions, in chemical identities, concentrations, and/or distributions of the dipole materials (or dipole elements if the stoichiometric ratio is not maintained). This provides the tunability of the threshold voltages of the respective transistors separately from each other, and potentially, differently from each other. Although not explicitly illustrated in FIG. 8, in some embodiments, the thermal drive-in operation of process 402 is configured to form an intermixing layer at the interface of the remaining portion of the dipole layer 302 and the modified gate dielectric portions 246B and 246D (e.g. modified with the dipole material composition 2002). For example, the intermixing layers are formed on the modified gate dielectric portions 246B and 246D, which may each include the dipole material of dipole layer 302 at a concentration of about 40% to about 60%. In other words, this intermixing layer include characteristics (e.g. the etching resistances) of both the gate dielectric layer 246 and the dipole layer 302. In some embodiments, the concentrations of the dipole material in the intermixing layers are each greater than the dipole material in the gate dielectric portions 246B and 246D, respectively. Meanwhile, the gate dielectric portions 246A and 246C do not include such intermixing layers.

As described above, a substantial portion of the dipole layer 302 are not driven into the gate dielectric portions 246B and 246D at the conclusion of the thermal drive-in operation of process 402, and therefore remain on surfaces of the gate dielectric portions 246B and 246D (e.g. on surfaces of the intermixing layer on the surfaces of the gate dielectric portions 246B and 246D). Still referring to block 1040 of FIG. 1 and to FIG. 8, the process 402 proceeds to remove those remaining portions of the dipole layer 302 in an etching operation such that surfaces of the modified gate dielectric portions 246B and 246D (or doped gate dielectric portions 246B and 246D) are exposed. In some embodiments, the exposed surfaces of the modified gate dielectric portions 246B and 246D each includes the dipole material of the dipole layer 302 at a concentration less than about 40% to about 60%. The etching operation of the process 402 may include one or more etching processes (or stripping processes), which may be a dry etching process, a wet etching process, a reactive ion etching process, or another etching process and has a high etching selectivity with respect to the dipole layer 302 relative to the gate dielectric layer 246. In some embodiments, the etching operation of the process 402 is a wet etching operation. It is noted that the removal of the remaining portions of the dipole layer 302 frees up limited spaces within the gate trenches 241 such that additional gate layers, such as another dipole layer (e.g. dipole layer 304 described later), another gate dielectric layer (such as gate dielectric layer 246' described later), other gate layers, or assistive layers that is required or beneficial for the proper functioning or improved functioning of the transistors, may be formed in the gate trenches 241. Accordingly, embodiments implementing the etching operation of process 402 provide an improved device as compared to approaches not implementing such a process.

Following the process 402, the gate dielectric portions 246A-246D each has a thickness d2A-d2D, respectively. As described above, as the etching operation are configured to have an etch selectivity with respect to the dipole layer 302 relative to the gate dielectric layer 246 (or the unmodified gate dielectric portions 246A and 246C), the thicknesses d2A and d2C are each substantially the same as the thicknesses d1A and d1C. However, because of the presence of significant amount of dipole material, the etching operation may recess the intermixing layer on the modified gate dielectric portions 246B and 246D. Accordingly, following the etching operation, the thicknesses d2B and d2D of the gate dielectric portions 246B and 246D, respectively, are reduced as compared to the thicknesses d1B and d1D, and as compared to the thicknesses d2A and d2C. As will be described in detail later, the reduction in the thickness of the gate dielectric portions 246B and 246D reduces the channel resistance $R_{ch}$ of the transistors 100B and 100D, respectively. Moreover, as described later, the etching parameters of the etching operation of the process 402 may be adjusted to tune the amount of the intermixing layer removed, thereby tuning the remaining thickness d2B and d2D, and further to adjust the channel resistance $R_{ch}$.

Following the process 402, the gate dielectric portions 246A and 246C, as well as gate dielectric portions 246B and 246D are exposed in the gate trenches 241. Moreover, the gate dielectric portions 246B and 246D may be thinner than the gate dielectric portions 246A and 246C. In other words, the surfaces of the gate dielectric portions in different substrate regions are unleveled (or stepped). Furthermore, the gate dielectric portions 246B and 246D now have compositions different from those of the gate dielectric portions 246A and 246C, in that they include the dipole material composition 2002 while the gate dielectric portions 246A and 246C do not. As described above, this distinction alone (e.g. the presence and absence of the dipole material composition 2002) enables the transistors 100B/100D to have threshold voltages that differ from the transistors 100A/100C even when other aspects of the transistors are identical.

Figure 9:
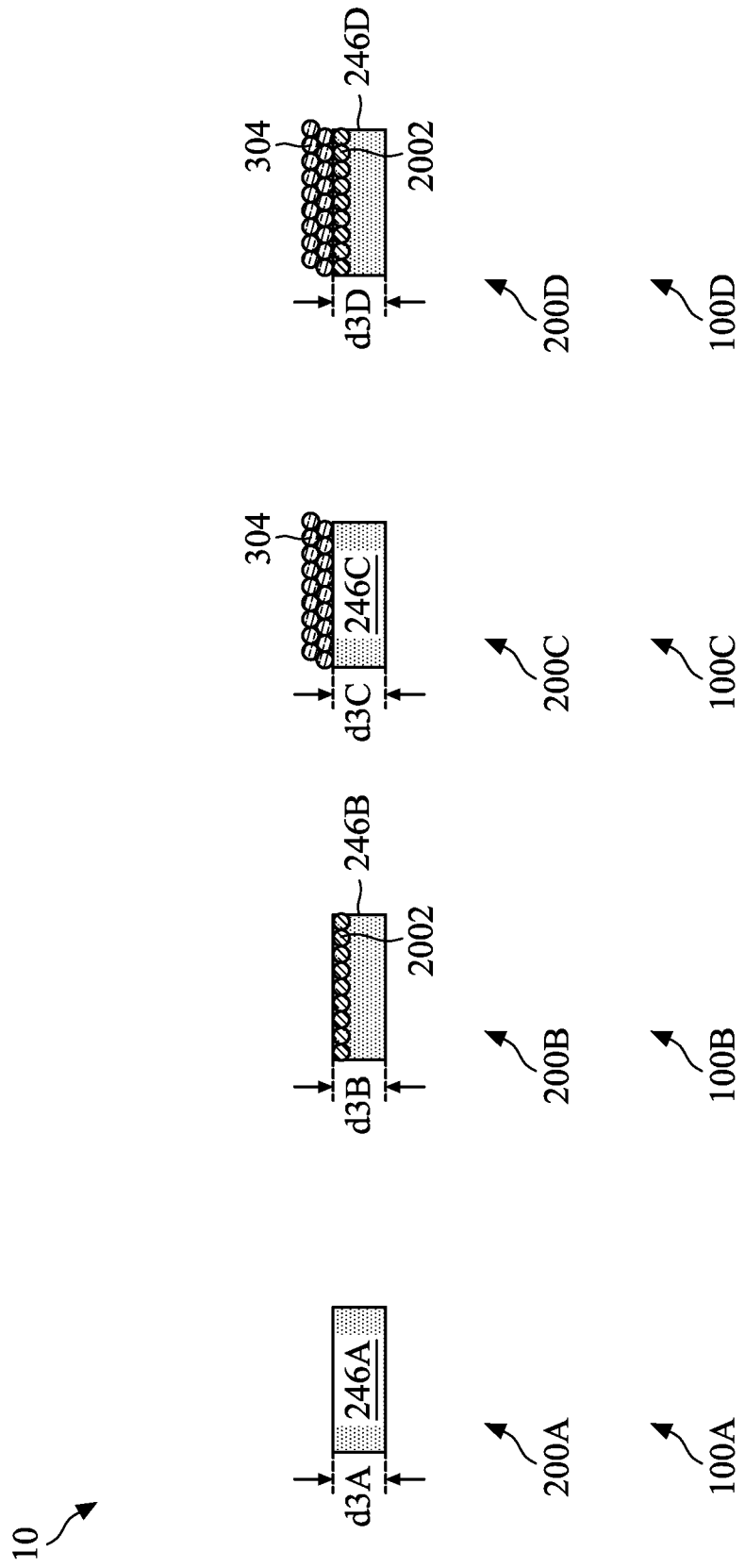

Referring to block 1050 of FIG. 1 and to FIG. 9, the method proceeds to form another dipole layer in the gate dielectric layer in regions configured for certain transistors. For example, another dipole layer 304 is formed over a subset of the gate dielectric portions 246A-246D. In some embodiments, the dipole layer 304 may similarly include an n-dipole material (e.g. $GeO_2$, $Y_2O_3$, $La_2O_3$, SrO, other suitable n-dipole materials, or combinations thereof) or a precursor to an n-dipole material, a p-dipole material (e.g. $Al_2O_3$, $Ga_2O_3$, MgO, $HfO_2$, $TiO_2$, $ZrO_2$, ZnO, other suitable p-dipole materials, or combinations thereof) or a precursor to a p-dipole material. In some embodiments, the dipole layer 304 includes a dipole material that is the same as that of the dipole layer 302. Having the dipole layers 302 and 304 with the same dipole material simplifies the processing and reduces costs. Alternatively, in some embodiments, the dipole layer 304 may include a dipole material different from the dipole layer 302. Having the dipole layers 302 and 304 with different dipole materials provides further opportunities to adjust the threshold voltages of individual transistors, and potentially improves functionality. In some embodiments, the dipole layer 304 may be deposited to a substantially uniform thickness in a range from about 0.5 Å to about 10 Å in various embodiments, such as from about 3 Å to about 5 Å. If the thickness is too small (such as less than 0.5 Å), the dipole layer 304 may be too weak for Vt tuning in some instances. If the thickness is too large (such as greater than 10 Å), the dipole layer 304 may be too strong for Vt tuning and may create side effects such as degraded mobility in the channel layers 120. In some embodiment, a thicker dipole layer 304 leads to a greater change in the transistor's threshold voltage. In some embodiments, the thickness of the dipole layer 304 may be less than the thickness of the dipole layer 302. For example, in some embodiments, the dipole layer 302 may have a thickness t1 and the dipole layer 304 may have a thickness t2. A difference between the thicknesses (t1−t2) may be about 0.1 Å to about 2 Å, for example, about 0.3 Å to about 1 Å. In some embodiments, this difference in thickness provides more latitude in adjusting the amount of the dipole material of the dipole layer 304 that subsequently diffuse into the gate dielectric portions 246C and 246D. If the difference is too small, there may not be sufficient difference in final dipole material compositions between the gate dielectric portions 246C/246D from those of the gate dielectric portions 246A/246B. If the difference is too large, the additional material may not bring significant difference in the diffusion behavior. Alternatively, in some embodiments, the thickness t1 is less than the thickness t2 to meet certain specific design needs (such as to create a specific threshold voltage cascade).

As described above, the dipole layer 304 is formed only on a subset of the gate dielectric portions 246A-246D (in other words, only formed for a subset of the transistors 100A-100D). In some embodiments, the dipole layer 304 is first formed across all transistors 100A-100D, and subsequently removed from certain transistor regions, such as from the regions configured for the transistors 100A and 100B. Accordingly, the dipole layer 304 remain only on the gate dielectric portions 246C and 246D, and not on the gate dielectric portions 246A and 246B. The removal process may alter the thicknesses of some of the gate dielectric portions. Accordingly, at this processing stage, the gate dielectric portions may each have thicknesses d3A-d3D. In some embodiments, the thicknesses d3A and d3B may be similar to the thicknesses d2A and d2B (due to good etching selectivity); while the thicknesses d3C and d3D may be substantially the same as the thicknesses d2C and d2D. In the depicted embodiments, the dipole layer 304 directly interfaces with the gate dielectric portion 246C without the dipole material composition 2002 formed therein. And the dipole layer 304 further directly interfaces with the gate dielectric portion 246D with the dipole material composition 2002 formed therein. In other words, where the dipole layer 304 includes a material different from that of the dipole layer 302, the top surface of the gate dielectric portion 246D may include two different dipole materials.

Figure 10:
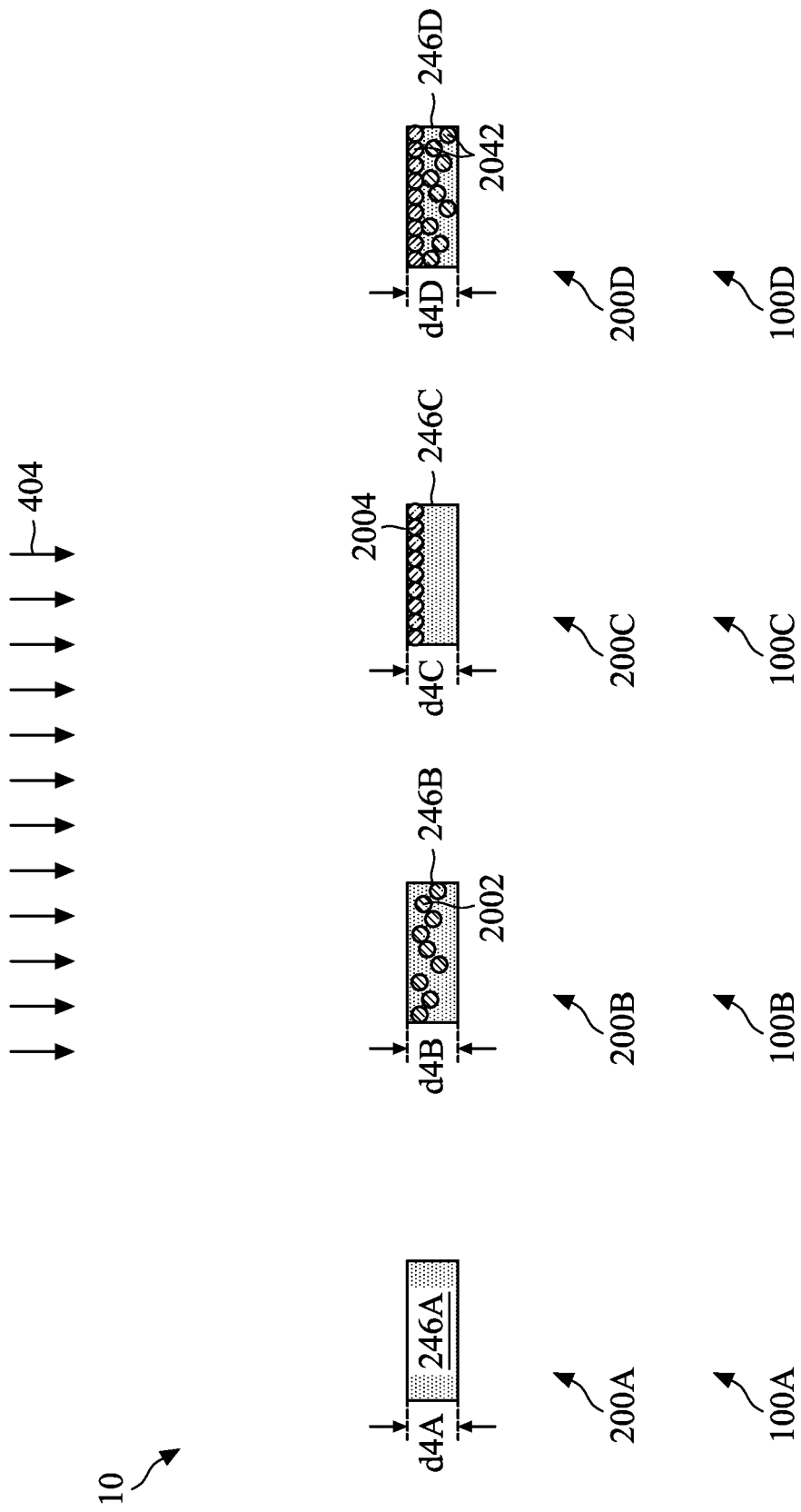

Referring to block 1060 of FIG. 1 and to FIG. 10, another process 404 is conducted. In some embodiments, the process 404 includes a thermal drive-in operation. The thermal drive-in operation of the process 404 may be similar to the thermal drive-in operation of the process 402 described above with respect to FIG. 8. In some embodiments, the thermal drive-in operation of the process 404 may implement the same or different parameters from those of the thermal drive-in operation of the process 402. In some embodiments, the thermal drive-in operation may implement a temperature lower than that of the thermal drive-in operation of the process 402. For example, the thermal drive-in operation of the process 402 may implement a soak temperature T1, and the thermal drive-in operation of the process 404 may implement a soak temperature T2. A difference between the soak temperatures (T1-T2) may be about 50° C. to about 250° C., for example, about 100° C. to about 200° C. Adopting a higher annealing temperature during the process 402 and a lower annealing temperature during the process 404 allows better control of the diffusion behaviors of the dipole materials and consequently provides more precision control in the dipole material distribution in the respective gate dielectric portions. As a result, better tuning of the threshold voltages is received. If the difference in temperature (T1-T2) is too small, this benefit may be lost; while if the difference is too large, either the diffusion in the thermal drive-in operation may become hard to control, or the diffusion in the thermal drive-in operation may become insufficient. In some alternative embodiments, the temperature T2 may be higher than the temperature T1. For example, in some embodiments, implementing a higher temperature T2 may be useful to drive in dipole materials of the dipole layer 304 in an amount greater than that of the dipole layer 302 and/or with a distribution broader than that of the dipole layer 302. In some embodiments, such greater amount and/or broader distribution may be beneficial to achieve particular threshold voltage configurations. Moreover, in some embodiments, the thermal drive-in operation of the process 404 may implement a time duration that is greater or less than that of the thermal drive-in operation of process 402, such that the dipole material of the dipole layer 304 may migrate deeper or shallower into the gate dielectric portions 246C and/or 246D than those of the dipole layer 302 into the gate dielectric portions 246B and/or 246D. In some embodiments, the thermal drive-in operation of the process 404 is configured to drive the dipole materials of the dipole layer 304 deeper (than that of the process 402 on the dipole material composition 2002 at this processing stage) into the respective gate dielectric portions, despite using a lower anneal temperature and/or on a thinner dipole layer (as compared to the dipole layer 302). In some embodiments, the thermal drive-in operation of the process 402 may have a time duration $\tau_1$; the thermal drive-in operation of the process 404 may have a time duration $\tau_2$, In some embodiments the time duration $\tau_2$ may be greater than the time duration $\tau_1$. For example, a difference ($\tau_2-\tau_1$) may be about 1 second to about 30 minutes, such as about 30 seconds to about 10 minutes. If the time difference is too small, the dipole material of the dipole layer 304 may not reach the desired depth; if the time difference is too large, the dipole material may diffuse so deep as to reach the channel layers 120 and adversely affect device performance.

The thermal drive-in operation of the process 404 has two primary effects. The first effect is that the dipole material compositions 2002 already within the gate dielectric portions 246B and 246D (see FIG. 10) further migrate deeper therein, such that they may be distributed closer to the channel layers 120. The second effect is that the dipole materials of the dipole layer 304 diffuse into the gate dielectric portions 246C and the gate dielectric portions 246D. As a result, the gate dielectric portions 246C and 246D both include a specific dipole material composition 2004. The dipole material composition 2004 may be configured differently from the dipole material composition 2002 either in chemical identity or in concentrations. For example, the dipole material composition 2002 may include $La_2O_3$ while the dipole material composition 2004 may include $Y_2O_3$. Alternatively or additionally, the dipole material composition 2002 and 2004 may both include the respective dipole materials (either the same or different from each other) at different concentrations. These parameters may be adjusted to tune the threshold voltage differences between the transistors.

In the gate dielectric portion 246D, the dipole material composition 2002 (see FIG. 8) is modified with the further diffusion-in of the dipole materials from the dipole layer 304, thereby forming dipole material composition 2042 (or diffusion feature 2042). The dipole material composition 2042 may be similar to a combination of the dipole material composition 2002 and dipole material composition 2004. Where the materials of the dipole layer 302 and dipole layer 304 are different, the dipole material composition 2042 includes a mixture in the gate dielectric portion 246D. Where the materials of the dipole layer 302 and dipole layer 304 are the same, the dipole material composition 2002, 2004, and 2042 each include the same dipole material, although at different concentrations and with different distribution profiles. The dipole material composition 2042 may include the dipole material at the highest concentration which may be similar to the sum of the concentrations in the dipole material compositions 2002 and 2004. Furthermore, in some embodiments, the dipole material composition 2002 may be distributed deeper than the dipole material composition 2004 (because it experienced two thermal drive-in operations as opposed to one for the dipole material composition 2004); while the dipole material composition 2042 may have a broader distribution than the dipole material compositions 2002 and 2004.

Still referring to block 1060 of FIG. 1 and to FIG. 10, following the conclusion of the thermal drive-in operation, remaining portions of the dipole layer 304 on the gate dielectric layer are selectively removed in an etching operation of the process 404, similar to the etching operation of the process 402 described above. Accordingly, valuable space of the gate trenches 241 are not occupied by the dipole layer 304. Similar to those already described above with respect to FIG. 8, the thermal drive-in operation of the process 404 may have been configured to produce an intermixing layer between the remaining portions of the dipole layer 304 and the gate dielectric portions 246C and 246D, which is absent from the gate dielectric portions 246A and 246B. Accordingly, the etching operation may be configured to have a good etching selectivity with respect to the dipole layer 304 relative to the gate dielectric layer 246. Yet the presence of the intermixing layer may enable the etching operation to recess the top surfaces of the gate dielectric portions 246C and 246D. This reduces the thicknesses of the respective gate dielectric portions and the channel resistances in the transistors 100C and 100D. For example, following the etching operation of the process 404, the gate dielectric portions 246A-246D may each has a thickness d4A-d4D, respectively. The thickness d4A and d4B may be substantially the same as the thicknesses d3A and d3B due to the etching selectivity; while the thickness d4C and d4D may be less than the thicknesses d3C and d3D, respectively, due to the removal of the intermixing layer. In some embodiments, the thickness d4C may be configured to be less than the thickness d4B. This allows for a trend of declining thickness going from gate dielectric portions 246A, 246B, 246C, to 246D. Accordingly, as described later, a declining trend in the channel resistances is also received. This may be beneficial in application where continuous adjustment of resistances are important. The relative magnitude of the thickness d4C as compared to the thickness d4B may be controlled by controlling the parameters of the process 404 as compared to the process 402. For example, the thermal drive-in operation of process 404 may be configured to be at a temperature higher than that of the process 402 or for a duration longer than that of the process 402. Accordingly, the intermixing layer formed on the gate dielectric portion 246C may be thicker than that on the gate dielectric portion 246B. As a result, in the etching operation of the process 404, a thicker portion of the gate dielectric portion 246C (as compared to that of the gate dielectric portion 246B in the etching operation of process 402) may be removed. In some embodiments, the thickness d4B may be less than the thickness d4C. Such a configuration provides a zigzag trend in the channel resistances in the adjacent transistors 100A-100D, and may be beneficial to control the overall resistance shift to stay within a certain threshold.

At this processing stage, gate dielectric portions 246A-246D are each configured differently from one another. For example, the gate dielectric portion 246A does not include a dipole material; the gate dielectric portion 246B includes the dipole material composition 2002; the gate dielectric portion 246C includes the dipole material composition 2004; and the gate dielectric portion 246D includes the dipole material composition 2042 (or the combination of dipole materials 2002 and 2004). The dipole material compositions 2002, 2004, and 2042 differ from each other in the chemical identity, concentration, and/or distribution within the respective gate dielectric portion. Because each of these parameters affect the threshold voltage of the transistor formed therefrom, transistors 100A-100D incorporating these gate dielectric portions may provide different threshold voltages even if they include the same gate electrode layer. Moreover, the thickness d4A may be substantially similar to the thickness d1A, and may be greater than the thicknesses d4B-d4D; the thickness d4D may be less than the thicknesses d4B and d4C.

Figure 11:
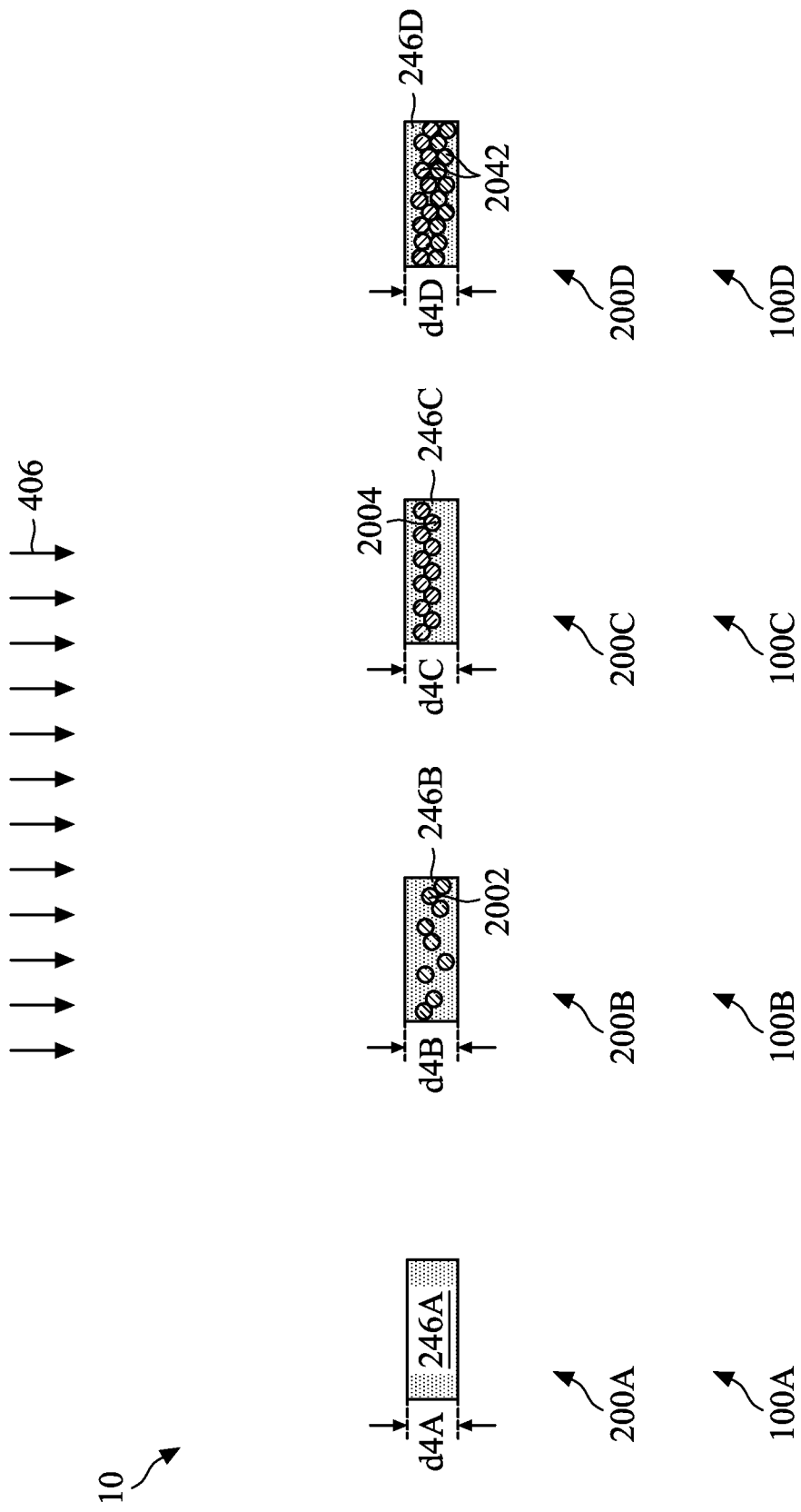

In some embodiments, referring to block 1070 of FIG. 1 and FIG. 11, a process 406 is conducted to further adjust the location and/or distribution of the dipole materials within the gate dielectric portions 246A-246D. In some embodiments, the process 406 includes a thermal operation (or annealing operation). For example, the device 10 is annealed at a temperature of about 600° C. to about 1,000° C., such as about 700° C. to about 800° C., with $O_2$, $N_2$, or a mixture of $O_2$ and $N_2$ ambient. In another embodiment, the process 406 is a furnace anneal process at a temperature in a range from about 300° C. to about 600° C. with $O_2$, $N_2$, or a mixture of $O_2$ and $N_2$ ambient for about 1 second to about 30 minutes. In yet another embodiment, the process 406 is a spike anneal process. In still another embodiment, the process 406 is a laser anneal process or a microwave anneal process at a temperature in a range from about 800° C. to about 1,200° C. with $O_2$, $N_2$, $NH_3$, $H_2$, or a mixture thereof for about 1 millisecond to about 10 seconds. In some embodiments, the process 406 is configured to cause further migration of the dipole materials towards the channel layers 120. As described later, this may improve the effectiveness of threshold voltage tuning. In some embodiments, the process 406 may be configured to cause the dipole materials within the gate dielectric portions to be randomized and reach a normalized distribution (as opposed to a trailing distribution), such that the control of the threshold voltage may be improved. In some embodiments, although not specifically depicted, the process 406 is instead conducted between the process 402 and the process 404. In some embodiments, although not specifically depicted, the process 406 is conducted both between the process 402 and the process 404, as well as following the process 404. In some embodiments, the process 406 is omitted.

In some embodiments, additional dipole layers are formed over a subset of the gate dielectric portions, and additional thermal drive-in operations and etching operations are conducted to form transistors with additionally differentiated threshold voltages. In some embodiments, such additional dipole layers are omitted. In some embodiments (referring to the "A" branch of FIG. 1), the method 1000 proceeds to form the gate electrode layer 248 (block 1080 of FIG. 1) and to complete the fabrication of the gate structures 250. However, in some other embodiments, referring to the "B" branch of FIG. 1 and to FIG. 12, in some embodiments, another gate dielectric layer 246' is formed over the gate dielectric layer 246. The gate dielectric layer 246' may be similar to the gate dielectric layer 246 described above. In some embodiments, the gate dielectric layer 246' may include the same or different material and experience the same or different processing from the gate dielectric layer 246. For example, different portions of the gate dielectric layer 246' may be configured to include different dipole material compositions. In the depicted embodiments, the gate dielectric layer 246' are configured the same manner as the gate dielectric layer 246. For example, the gate dielectric layer 246' of the transistor portion 200A may include no dipole materials; the gate dielectric layer 246' of the transistor portion 200B may include dipole material composition 2002' which may be similar to the dipole material composition 2002 described above with respect to FIG. 10; the gate dielectric layer 246' of the transistor portion 200C may include dipole material composition 2004' which may be similar to the dipole material composition 2004 described above with respect to FIG. 10; the gate dielectric layer 246' of the transistor portion 200D may include dipole material composition 2042' which may be similar to the dipole material composition 2042 described above with respect to FIG. 10. Accordingly, after processing similar to those already described with respect to FIGS. 7-10, the processed gate dielectric layer 246' may be similar or same as the processed gate dielectric layer 246 described above with respect to FIG. 10. In other words, the processed gate dielectric layer 246 and 246' may be considered to be sublayers of a thicker gate dielectric structure. Additional gate dielectric layers may be further formed, and the cycle of processing of blocks 1020-1070 of FIG. 1 may be repeated until the desired total thickness of the gate dielectric layer is reached.

In some embodiments, forming the gate dielectric structure in a layer-by-layer approach may allow each layer (such as layer 246 and layer 246') to be thinner for better processability. Moreover, such an approach also allows better regulating of the distributions and profiles of the dipole materials within the gate dielectric structure, thereby improving the tuning capacity and reliability of the threshold voltage. For example, the threshold voltages may be incrementally adjusted to provide better precision in control. Alternatively, the gate dielectric layer 246' may include a material that differs from the gate dielectric layer 246 and/or adopt a configuration of dipole materials different from that of the gate dielectric layer 246. In such embodiments, more substrate regions with different dipole configurations may be provided which provides even more opportunity to create multi-Vt offerings. In some embodiments, additional gate dielectric layers may be formed over the gate dielectric layer 246' and processed in ways similar to those already described above with respect to FIGS. 7-11.

Figure 12:
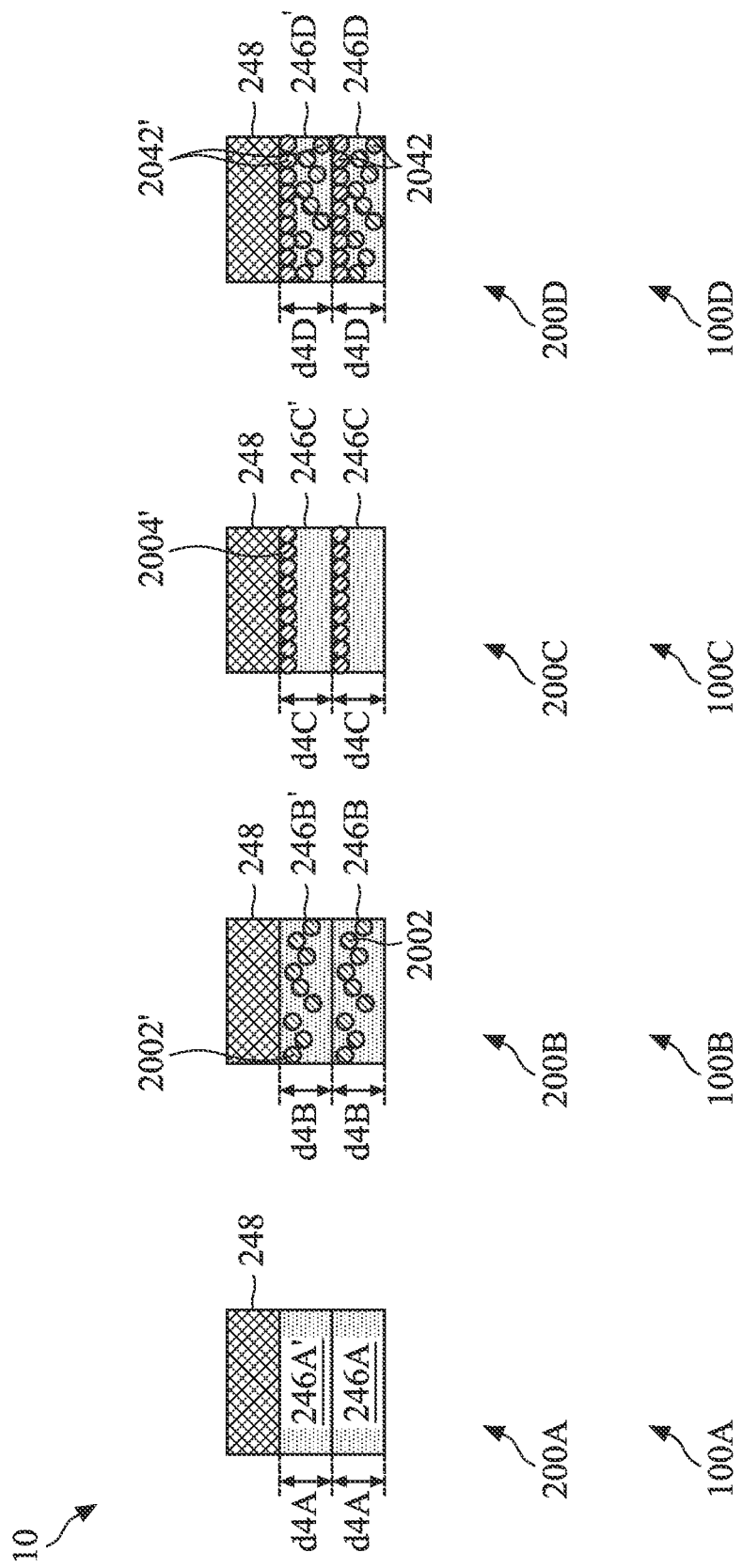

Referring to block 1080 of FIG. 1 and to FIG. 12, the method 1000 forms a gate electrode layer 248 over the processed gate dielectric layer(s). The gate electrode layer 248 is formed on the top surface of the gate dielectric layer 246' (or additional gate dielectric layers formed thereon). Referring back to FIGS. 2B and 2C, the gate electrode layer 248 wraps around the gate dielectric layer 246 over each of the channel layers 120. The gate electrode layer 248 may completely or partially fill the gate trenches 241 in various embodiments. The gate electrode layer 248, in combination with the gate dielectric layers, is designed to provide proper threshold voltages for the various NMOS and PMOS transistors. In some embodiments, the gate electrode layer 248 for the NMOS transistors 100A-100D include any suitable n-type work function metal materials, such as titanium nitride (TiN), ruthenium (Ru), iridium (Ir), osmium (Os), rhodium (Rh), or combinations thereof. The gate electrode layer 248 for the PMOS transistors 100A'-100D' include any suitable p-type work function metal materials, such as titanium (Ti), aluminum (Al), tantalum (Ta), titanium aluminum (TiAl), titanium aluminum nitride (TiAlN), tantalum carbide (TaC), tantalum carbide nitride (TaCN), tantalum silicon nitride (TaSiN), or combinations thereof. Although not explicitly illustrated, the gate electrode layer 248 of NMOS and/or PMOS transistors may further include a fill metal layer. The fill metal layer may include any suitable materials, such as aluminum (Al), tungsten (W), copper (Cu), cobalt (Co), nickel (Ni), platinum (Pt), ruthenium (Ru), or combinations thereof. The conductive metal layer fills the remaining spaces of the gate trenches 241. In some embodiments, a Chemical Mechanical Polishing operation is performed to expose a top surface of the ILD layer 230. Accordingly, the gate dielectric layer 246 and the gate electrode layer 248 collectively form the high-k metal gate stack that replaces the original dummy gate stack 240. The high-k metal gate stack and the gate spacer layers 201 and 202 collectively form the new gate structures 250. The gate structures 250 engage multiple channel layers 120 to form multiple gate channels. Referring to block 1090 of FIG. 1, the method 1000 proceeds to complete the fabrication of the device. For example, silicide features, contact features, via features, metal lines, passivation layers, among others may be formed.

In the present embodiment, the difference in the threshold voltages of the transistors can be completely tuned by the dipole material incorporations discussed above so that a common gate electrode layer 248 can be used for all the NMOS transistors (such as transistors 100A-100D) or for all the PMOS transistors (such as transistors 100A'-100D'). This obviates the need of using different work function metal layers (or different gate electrode layers) to achieve the variety in the threshold voltages. Thus, embodiments of the present disclosure enable the use of thinner work function metal layer(s) for the device 10 than other approaches, and are suitable for miniaturized multi-gate devices, such as nanosheet-based devices. It is noted that the gate electrode layer 248 may include multiple sub-layers, but it is still a common layer for multiple transistors (such as transistors 100A-100D or transistors 100A'-100D'). In some embodiments, the transistors 100A-100D (or the transistors 100A'-100D') may each include different gate electrode layers to provide even further (or larger) tuning magnitude of the threshold voltages. In some embodiments, the present disclosure may further be implemented to enable transistors of different conductivity types (e.g. NMOS and PMOS) to use the same gate electrode layers.

Figure 13:
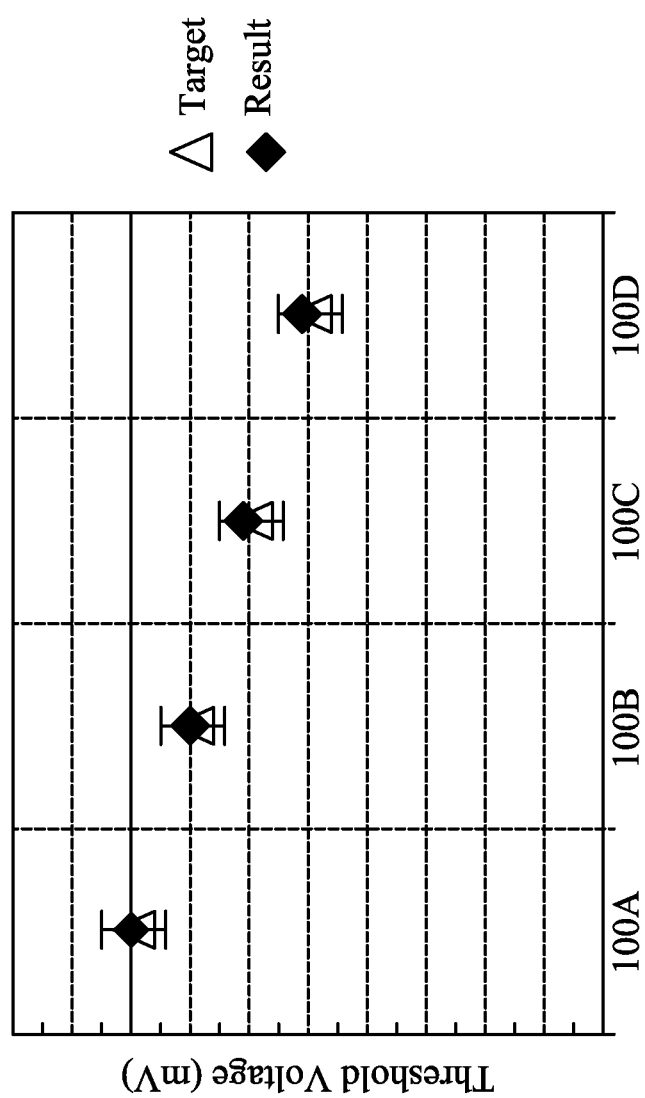
FIGS. 13, 22, 23A, 23B, 23C, 24, 25A, 25B, 26A, and 26B are data illustrating various aspects of embodiments of the present disclosure.

The embodiments provided above allows effective tuning of the threshold voltages. FIG. 13 shows a chart illustrating the Vt tuning capability according to an embodiment of the method. In this embodiment, transistors in a device (such as the device 10) are provided with 4 different threshold voltages. In this example, by incorporating dipole material composition 2002 in the transistor 100B, the threshold voltage is adjusted by −40 mV as compared to the transistor 100A without any dipole material. By incorporating dipole material composition 2004 in the transistor 100C, the threshold voltage is adjusted by −76 mV as compared to the transistor 100A. Moreover, by incorporating dipole material composition 2042 in the transistor 100D, the threshold voltage is adjusted by −114 mV as compared to the transistor 100A. Furthermore, these tuning capability matches well with the targeted values of the threshold voltages at −40 mV, −80 mV, and −120 mV, respectively. In other words, by simply tuning the presence and/or configuration (e.g. chemical identity, concentration, and distribution) of the dipole material compositions in the gate dielectric layers, multi-Vt device may be reliably achieved with tuning capacity as large as −120 mV. Moreover, the channel resistance penalty of an NMOS device formed this way has a reduced channel resistance penalty of about +0.03 kΩ-fin (as compared to +0.1 kΩ-fin with some other approaches). Meanwhile, the channel resistance penalty of a PMOS device formed this way has a negligible channel resistance penalty (as compared to +0.2 to +0.3 kΩ-fin with some other approaches). In other words, as compared to some other approaches, the method provides good Vt linearity, comparable leakage current (Igi), and low channel resistance penalties. Device improvements are thus received with the methods described herein.

Figure 14:
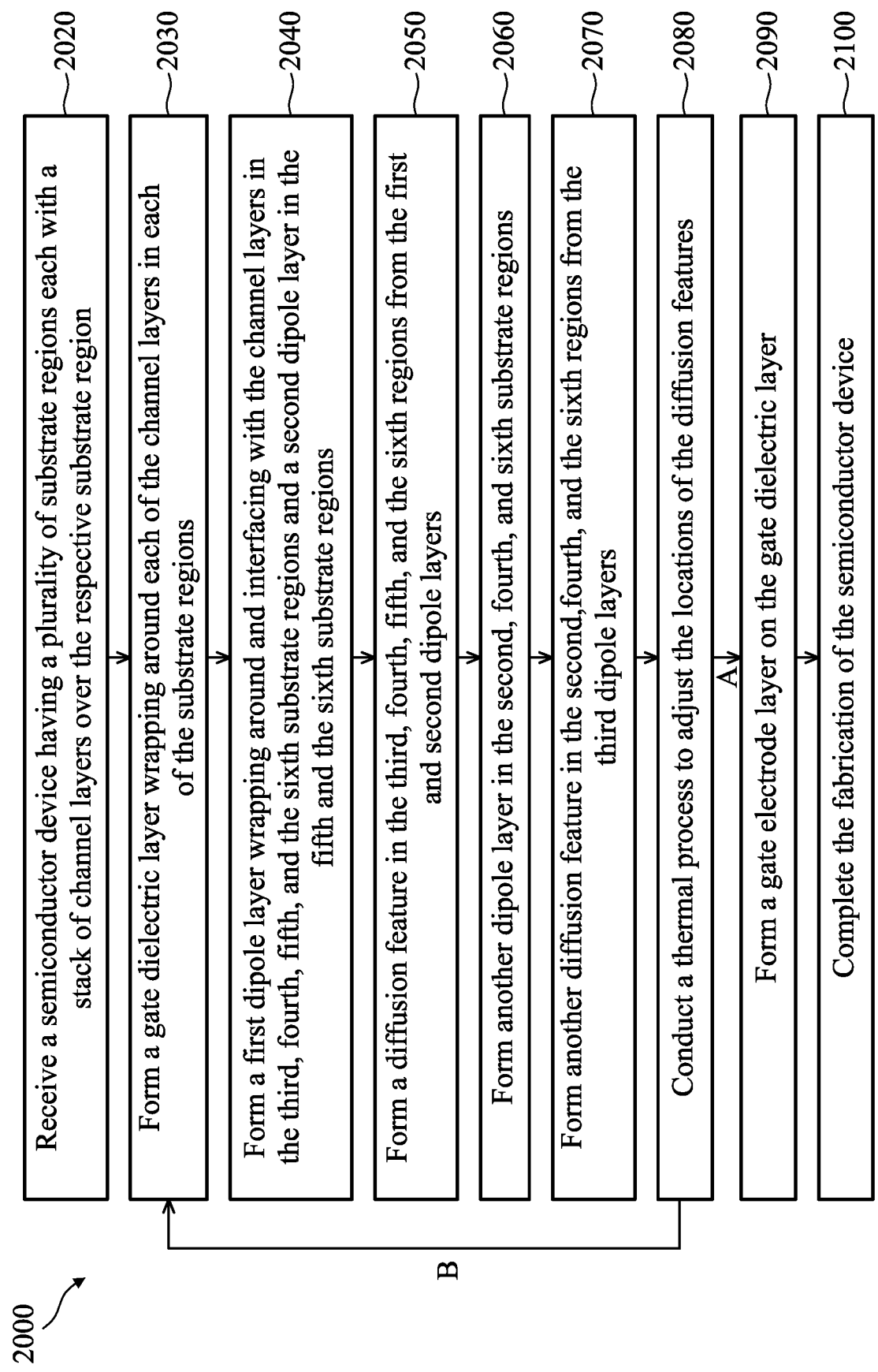
Figure 15:
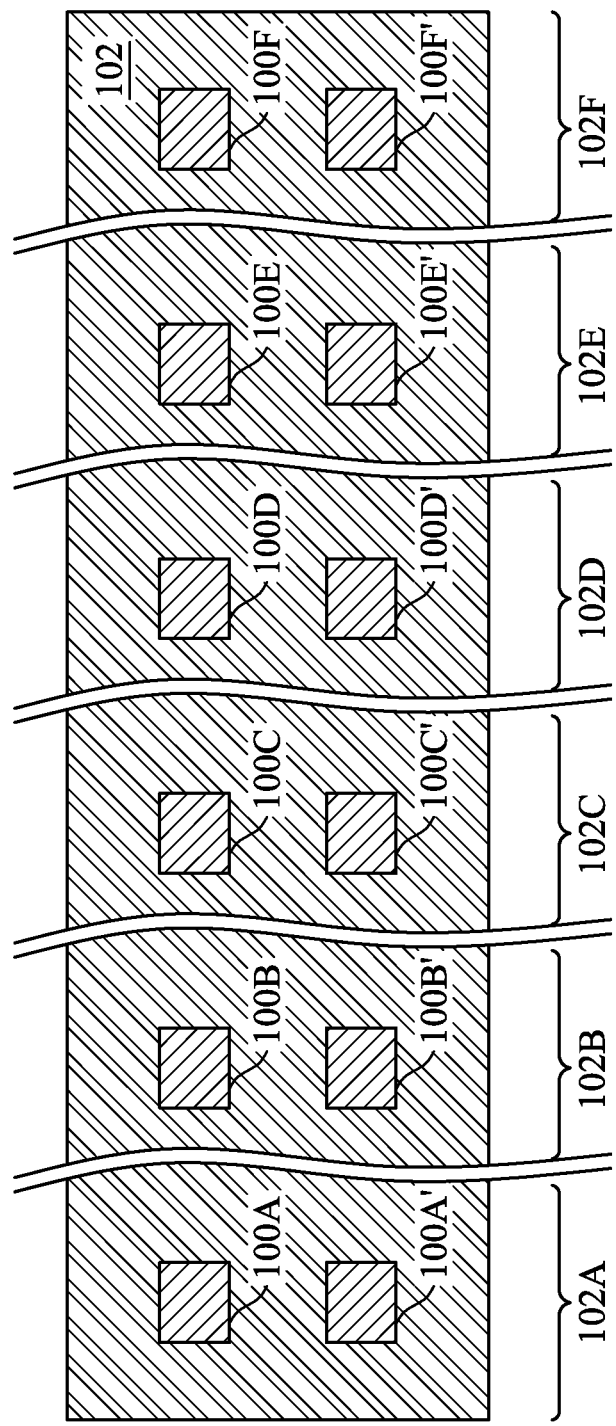

Embodiments of the present disclosure may be adjusted to provide even wider threshold voltage tuning capacities, without substantial increase in processing complexities. For example, FIG. 14 provides a flow chart of an alternative embodiment of the method of the present disclosure (method 2000) for fabricating a device 20. FIG. 15 provides a plan view of an embodiment of devices (such as device 20) of the present disclosure according to some embodiments of the present disclosure. FIGS. 16-21 provide cross-sectional views of the device 20 at different processing stages according to the flow chart of FIG. 14. Method 2000 enables the fabrication of device 20 with NMOS transistors with six (6) different threshold voltages as well as PMOS transistors with another six (6) different threshold voltages. This is illustrated in FIG. 15, the device 20 generally resembles the device 10 of FIG. 1 with the exception that it includes six NMOS transistors 100A-100F and six PMOS transistors 100A'-100F'. It is noted that reference numerals in subsequent descriptions have been reused for simplicity and clarity.

Figure 16:
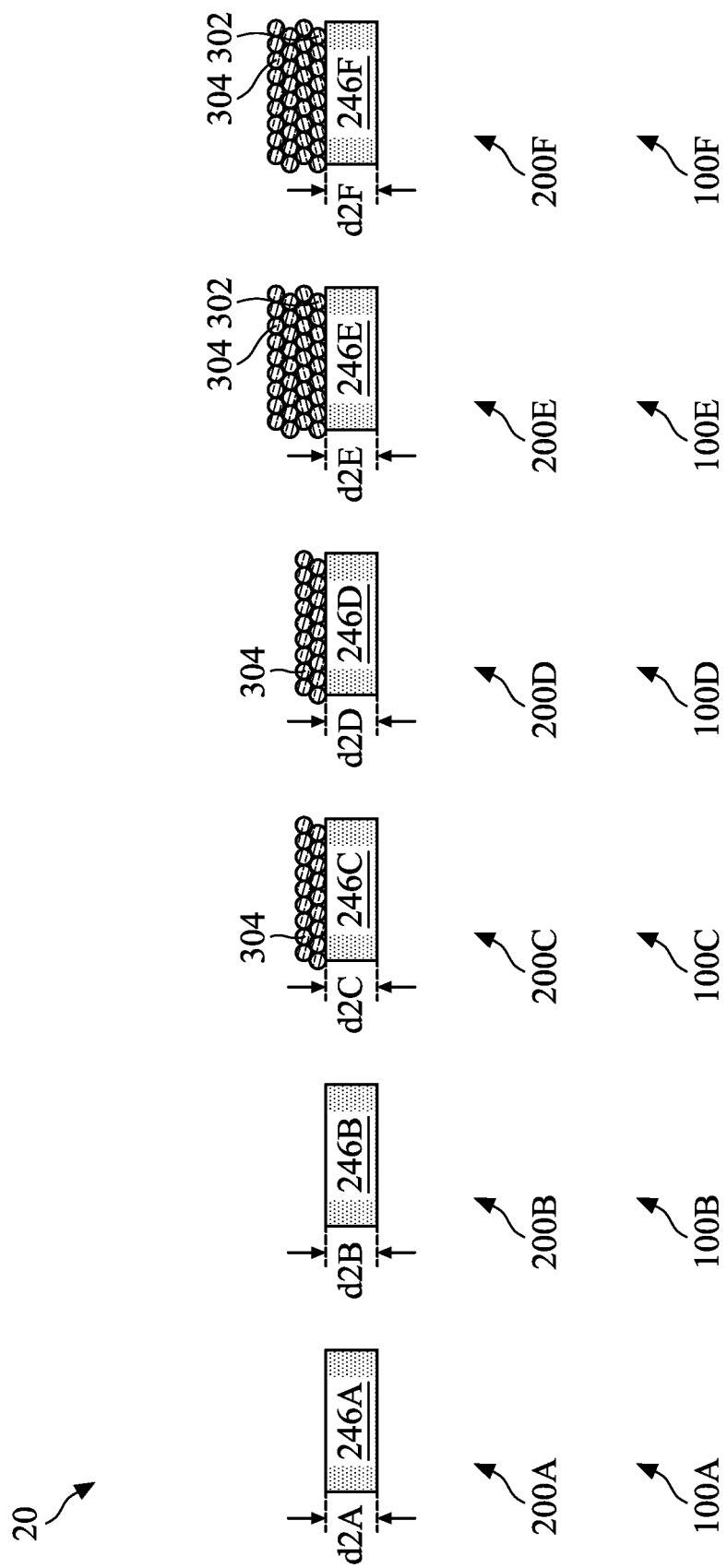

Referring to block 2020 of FIG. 14, the method 2000 starts with receiving a workpiece having the various transistors formed thereon, each with channel layers engaged by a dummy gate stack, similar to that described above with respect to FIGS. 2B and 2C. The method 2000 proceeds to remove the dummy gate stack 240 thereby forming the gate trenches 241, similar to that of FIG. 4. Referring to block 2030 of FIG. 14 and to FIG. 16, a gate dielectric layer 246 is formed in the gate trenches 241 around each of the channel layers 120, similar to that described above with respect to FIG. 5. Moreover, referring to block 2040 of FIG. 14 and to FIG. 16, dipole layers are formed on each of the gate dielectric portions 246A-246F. As illustrated in FIG. 16, the dipole layers are differently configured in different regions 100A-100F. For example, the gate dielectric portions 246A and 246B have no dipole layers formed thereon; the gate dielectric portions 246C and 246D have the dipole layer 304 thereon; and the gate dielectric portions 246E and 246F have both the dipole layer 302 and 304 thereon. Accordingly, at this processing stage, the surface of the transistor portions 100A-100F have unleveled surfaces. In other words, the material layers surrounding the gate dielectric portions 246E-246F in the transistor portions 200E-200F are thicker than those surrounding the gate dielectric portions 246C-246D in the transistor portions 200C-200D, which are thicker than those surrounding the gate dielectric portions 246A-246B in the transistor portions 200A-200B. The dipole layer 302 may be similar to the dipole layer 302 described above, for example, including a same material and having a same thickness. The dipole layers 304 may include the same or different materials as the dipole layers 302. Moreover, the dipole layers 302 and 304 may be conformal and have thicknesses adjusted based on the desired threshold voltage of the transistors, as described above. In the depicted embodiments, the dipole layer 304 has a thickness that is greater than the dipole layer 302 in order to provide greater concentration of dipole materials in the gate dielectric portions it interfaces with, as described in detail below.

Any suitable methods may be used to reach the configurations of the dipole layers 302 and 304 illustrated in FIG. 16. For example, the dipole layer 302 may be first blanketly and/or conformally formed across all device regions 100A-100F, and subsequently partially removed (e.g. patterned) such that it covers only the device regions 100A, 100B, 100E, and 100F. In other words, surfaces of the gate dielectric portions 246C and 246D in transistor portions 200C and 200D are exposed in the gate trenches 241. The dipole layer 304 is then formed on all exposed surfaces, which includes, for example, on the surface of the dipole layer 302 on (or around) gate dielectric portions 246A-246B and 246E-246F, as well as on (or around) the surface of the gate dielectric portions 246C and 246D. Accordingly, the dipole layer 304 is spaced away from the gate dielectric layer 246 in transistor portions 200A, 200B, 200E, and 200F but directly contacts the gate dielectric layer 246 in transistor portions 200C and 200D. The dipole layers 302 and 304 in the device regions 100A-100B is then removed while maintaining the dipole layers in the device regions 100C-100F, for example, by implementing a mask element covering device regions 100C-100F while exposing the device regions 100A and 100B. Any other suitable methods may alternatively be used.

Figure 17:
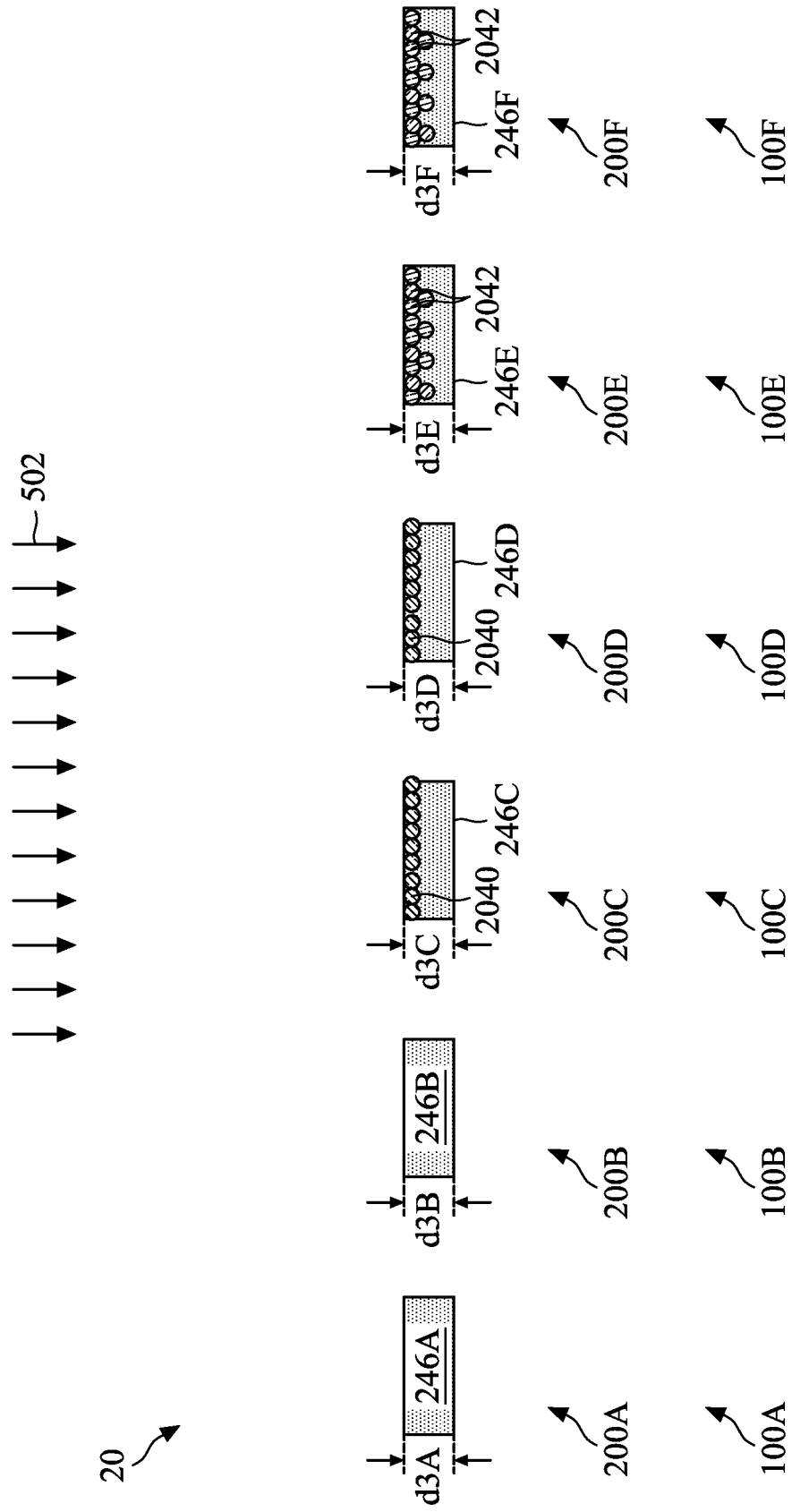

Referring to block 2050 of FIG. 14 and to FIG. 17, a process 502 is conducted. The process 502 may be similar to the process 402 described above with respect to FIG. 8. For example, the process 502 includes a thermal drive-in operation that causes the dipole materials of the dipole layer 302, as well as the dipole materials of the dipole layer 304, to diffuse into the respective gate dielectric portions thereunderneath. The thermal drive-in operation may be similar to the thermal drive-in operations of the process 402. For example, parameters of the thermal drive-in operation of process 502 may be adjusted to tune the amount of the dipole materials of the dipole layer 302 and/or the dipole materials of the dipole layer 304 to be driven into the gate dielectric layer 246. The parameters may include the anneal temperature and time duration. These parameters, along with the chemical identities of the dipole materials of dipole layers 302 and 304, as well as the thicknesses of the dipole layers 302 and 304, are configured to provide proper dipole material compositions within the respective gate dielectric portions, similar to those already discussed with respect to device 10. In some embodiments, because the dipole layer 302 directly interfaces with the gate dielectric portions 246E and 246F while the dipole layer 304 is spaced away from the gate dielectric portions 246E and 246F, a greater portion of the dipole layer 302 diffuses into the gate dielectric portions 246E and 246F than the dipole layer 304. Moreover, because there are more dipole materials on the gate dielectric portions 246E and 246F (e.g. both dipole layers 302 and 304) than on the gate dielectric portions 246C and 246D, a greater total amount (including dipole materials from the dipole layer 302 and the dipole layer 304) diffuses into the gate dielectric portions 246E and 246F than into the gate dielectric portions 246C and 246D.

Following the thermal drive-in operation, the gate dielectric portions 246A and 246B do not include any dipole materials. The gate dielectric portions 246C and 246D include dipole materials from the dipole layer 304 but not from the dipole layer 302. This combination of dipole material is referred to as the dipole material composition 2040. The gate dielectric portions 246E and 246F includes dipole materials from the dipole layer 304, as well as the dipole material from the dipole layer 302. This combination of dipole material is referred to as the dipole material composition 2042. Where the dipole layers 302 and 304 include different materials, the dipole material composition 2040 may be a single dipole material composition, while the dipole material 2042 includes a mixture. Where the dipole layers 302 and 304 include the same materials, the dipole material composition 2040 and the dipole materials composition 2042 may include the same material, although at different concentrations. Similar to those described above with respect to FIG. 8, a portion of the dipole layer 302 and a portion of the dipole layer 304 remain on surfaces of the gate dielectric layer 246 at the conclusion of the thermal drive-in operation of process 502. Subsequently, still referring to block 2050 of FIG. 14, these remaining portions are removed in an etching operation of the process 502, similar to the etching operation of the process 402 described above with respect to FIG. 8.

Accordingly, at this processing stage, portions of the gate dielectric layer 246 in different substrate regions include different dipole material compositions. This distinction alone enables the device 20 to provide three (3) different threshold voltages for each transistor types. Additionally, similar to the process 402, the thermal drive-in operation of the process 502 similarly produces an intermixing layer at the interface of the gate dielectric layer and the dipole layer 302 and/or 304. In some embodiments, this intermixing layer is recessed or removed during the etching operation of the process 502, similar to the situation in the etching operation of the process 402. As a result, the thicknesses of the respective gate dielectric portions may be reduced. For example, following the process 502, the gate dielectric portions 246A-246F each has a respective thickness of d3A-d3F. The thickness d3A and d3B may be substantially the same as the thickness d2A and d2B (compare FIG. 16) due to the etching selectivity implemented during the etching operation of the process 502. However, the thickness d3C-d3F may be each less than the thickness d2C-d2F, respectively, due to the removal of the intermixing layer.

Figure 18:
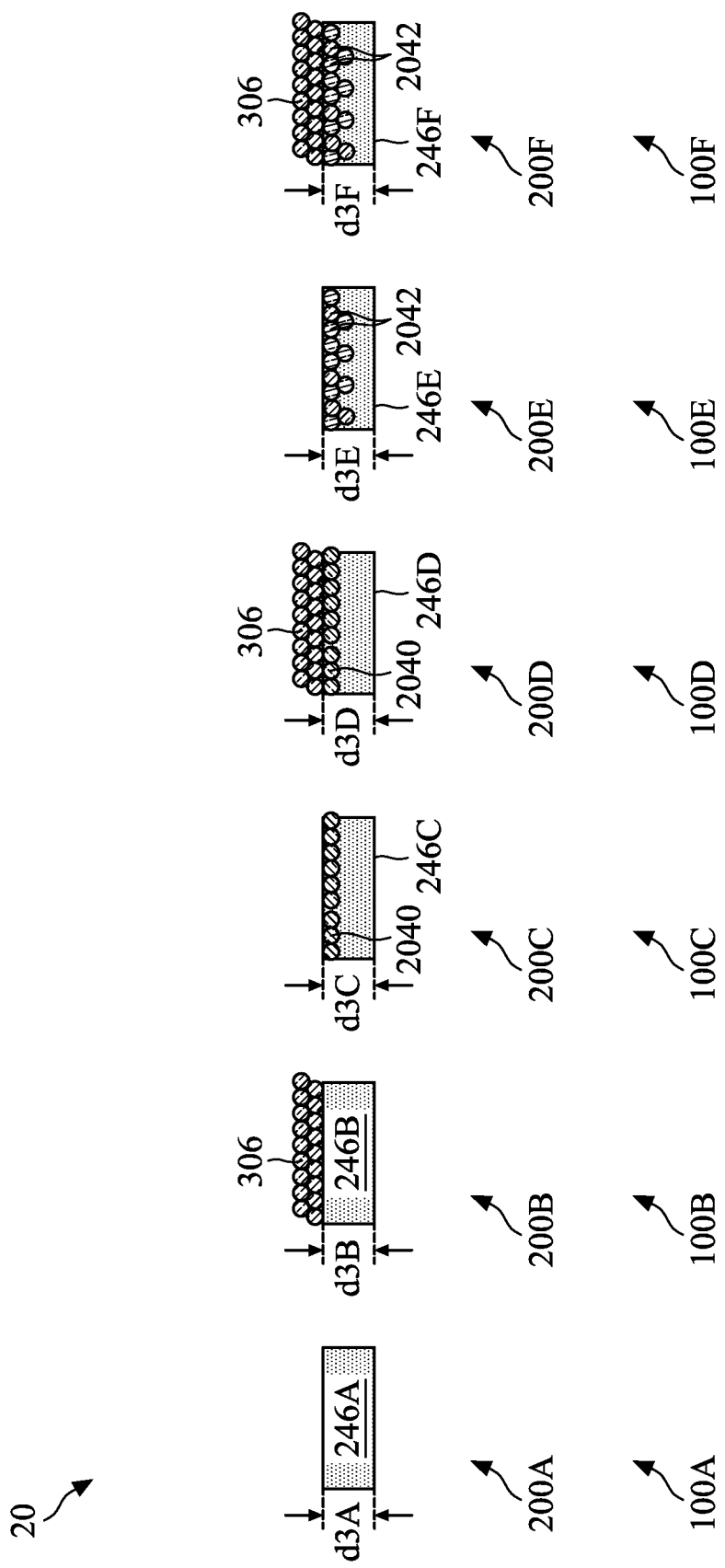

Referring to block 2060 of FIG. 14 and to FIG. 18, another dipole layer 306 is formed on the gate dielectric portions 246A-246F. In the depicted embodiments, the dipole layer 306 is formed on the gate dielectric portions 246B, 246D, and 246F, but not on the gate dielectric portions 246A, 246C, and 246E. The dipole layer 306 may be similar to the dipole layers 302 and/or 304. For example, the dipole layer 306 may include a material that is similar to or different from those of the dipole layers 302 and/or 304. In some embodiments, the dipole layer 306 has a thickness less than the dipole layer 304, which in turn has a thickness less than the dipole layer 302, for reasons similar to those discussed above with respect to FIG. 8. Any suitable methods may be used to reach the configuration provided in FIG. 18. For example, the dipole layer 306 may be formed conformally across all device regions 100A-100F, and on surfaces of the modified gate dielectric layer 246 as seen in FIG. 17. Subsequently, the dipole layer 306 is partially removed from surfaces of the gate dielectric portions 246A, 246C, and 246E, for example, by implementing a patterning operation. The bottom surfaces of the remaining dipole layer 306 may interface with gate dielectric portions with different dipole material compositions. For example, the dipole layer 306 directly interfaces with the gate dielectric portion 246B which includes no dipole materials; the dipole layer 306 directly interfaces with the gate dielectric portion 246D which includes dipole material composition 2040; and the dipole layer 306 directly interfaces with the gate dielectric portion 246F which include dipole material composition 2042.

Figure 19:
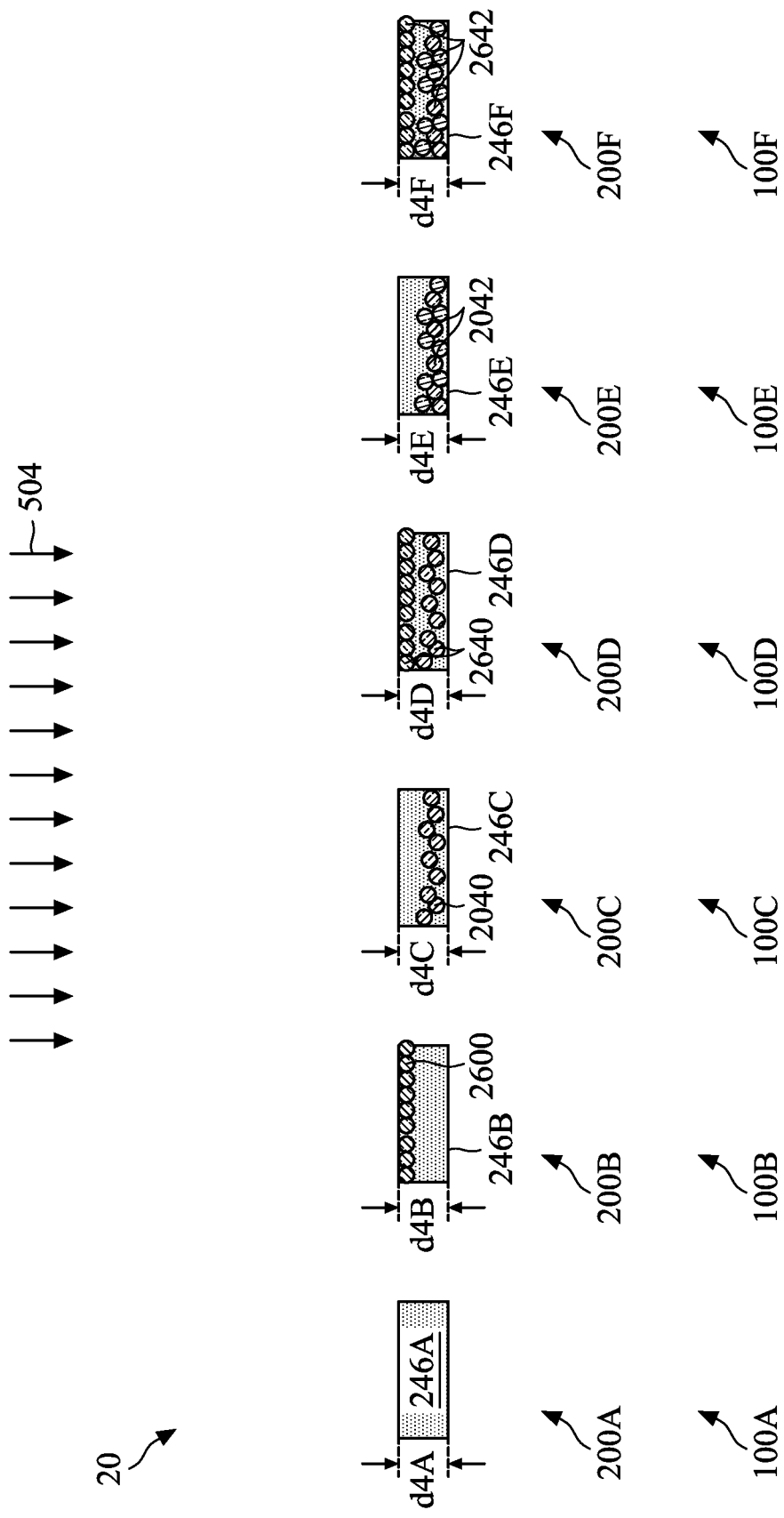

Referring to block 2070 of FIG. 14 and to FIG. 19, another process 504 is conducted. In some embodiments, the process 504 includes a thermal drive-in operation similar to the thermal drive-in operation of the process 404. In some embodiments, the thermal drive-in operation may implement same or different parameters from those of the thermal drive-in operation of process 502. In some embodiments, the thermal drive-in operation of the process 504 may implement a temperature lower than that of the thermal drive-in operation of the process 502. For example, the thermal drive-in operation of the process 502 may implement a soak temperature T1, and the thermal drive-in operation of the process 504 may implement a soak temperature T2. A difference between the soak temperatures (T1−T2) may be about 50° C. to about 250° C., for example, about 100° C. to about 200° C. Adopting a higher annealing temperature during the process 502 and a lower annealing temperature during the process 504 allows better control of the diffusion behaviors of the dipole materials and subsequently provides more precision control in the dipole material distribution in the respective gate dielectric portions. Consequently, better tuning of the threshold voltages is received. If the difference in temperature (T1−T2) is too small, this benefit may be lost; while if the difference is too large, either the diffusion in the thermal drive-in operation may become hard to control, or the diffusion in the thermal drive-in operation may become insufficient.

Furthermore, in some embodiments, the thermal drive-in operation of process 504 may implement a time duration that is greater or less than that of the thermal drive-in operation of process 502, such that the dipole material of the dipole layer 306 may migrate deeper or shallower into the gate dielectric portions 246B, 246D, and/or 246F than those of the dipole layer 302 or 304 into the gate dielectric portions 246C and/or 246E during the thermal drive-in operation of process 502 (see FIG. 17). In some embodiments, the thermal drive-in operation of the process 502 may have a time duration $\tau_1$; the thermal drive-in operation of the process 504 may have a time duration $\tau_2$. In some embodiments the time duration $\tau_2$ may be greater than the time duration $\tau_1$. For example, a difference ($\tau_2-\tau_1$) may be about 1 second to about 30 minutes, such as about 30 seconds to about 10 minutes. In some embodiments, the thermal drive-in operation of the process 504 is configured to drive the dipole materials of the dipole layer 306 deeper (than the thermal drive-in operation of process 502) into the respective gate dielectric portions, despite using a lower anneal temperature and/or on a thinner dipole layer (as compared to the dipole layer 302). If the time difference is too small, the dipole material of the dipole layer 306 may not reach the desired depth; if the time difference is too large, the dipole material may diffuse so deep as to reach the channel layers 120 and adversely affect device performance.

Regardless, because the dipole materials compositions 2040 and 2042 in the gate dielectric portions 246C and 246E, respectively, each undergo two thermal drive-in operations, they may migrate to an overall deeper region of the gate dielectric portions and be closer to the channel layers 120. Other parameters of the thermal drive-in operation of process 504 may be further adjusted based on the desired tuning range of the threshold voltages. As the conclusion of the thermal drive-in operation of process 504, the gate dielectric portion 246A includes no dipole materials; the gate dielectric portion 246B includes the materials of the dipole layer 306 and not those from the dipole layers 302 or 304. This dipole material combination is referred to as the dipole material composition 2600. The gate dielectric portion 246C is not affected by the formation of the dipole layer 306 or the thermal drive-in operation of process 504, such that it maintains the dipole material composition 2040 as described above. The gate dielectric portion 246D includes the dipole material composition 2040 prior to the formation of the dipole layer 306 and the thermal drive-in operation of process 504, and further received diffusions of the materials from the dipole layer 306. Accordingly, the gate dielectric portion 246D includes materials from the original dipole layer 304 as well as from the dipole layer 306. This combination is referred to as the dipole material composition 2640. The gate dielectric portion 246E is not affected by the formation of the dipole layer 306 or the thermal drive-in operation of process 504, such that it maintains the dipole materials composition 2042 as described above. The gate dielectric portion 246F includes the dipole material composition 2042 prior to the formation of the dipole layer 306 and the thermal drive-in operation of process 504, and further received diffusions of the materials from the dipole layer 306. Accordingly, the gate dielectric portion 246F includes materials from the original dipole layers 302 and 304, as well as from the dipole layer 306. This combination is referred to as the dipole material composition 2642.

Still referring to block 2070 of FIG. 14 and to FIG. 19, following the completion of the thermal drive-in operation, another etching operation is conducted, similar to the etching operation of process 404 and/or process 502. The etching operation of the process 504 not only removes the extra dipole materials over the gate dielectric layers, it also causes the thicknesses of the gate dielectric portions 246A-246F to vary amongst themselves. For example, the gate dielectric portions 246A-246F may have thicknesses d4A-d4F, respectively, following the etching operation of the process 504. In some embodiments, the thickness d4A, d4C, and d4E remain substantially the same as the thickness d3A, d3C, and d3E, respectively; although the thickness d4B, d4D, and d4F may be less than the thickness d3B, d3D, and d3F, respectively. As described above, this may be due to the formation of intermixing layers at the interface of the gate dielectric layer 246 and the dipole layer 306 in the relevant substrate regions. Also as described above, such reduction in layer thickness of the gate dielectric portions reduces the channel resistances $R_{ch}$.

In some embodiments, the dipole layers 302, 304, and 306 are different from each other in chemical identities and/or layer thicknesses. Furthermore, as described above, parameters of the thermal drive-in operations of the processes 502 and 504 may be different from each other. Accordingly, the dipole materials 2600, 2040, 2640, 2042, and 2642 differ from each other in chemical identities, concentrations, and/or distributions within the respective portions of the gate dielectric layer 246. As a result, when combined with the gate electrode layer, they each offer a unique threshold voltage that are different from each other and further different from that of the transistor 100A which includes no such dipole materials, regardless whether the gate electrode layer is the same or different.

Figure 20:
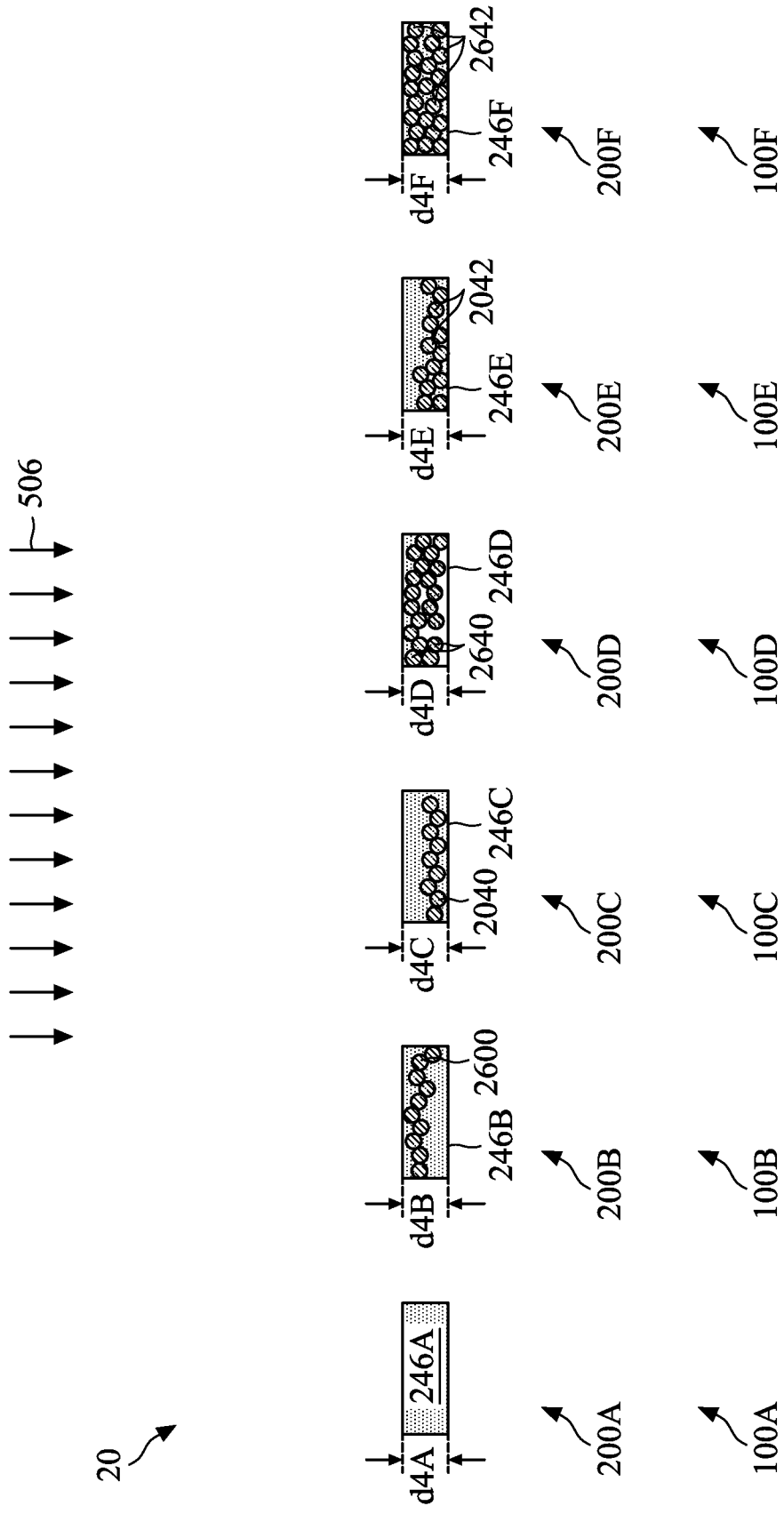
Figure 21:
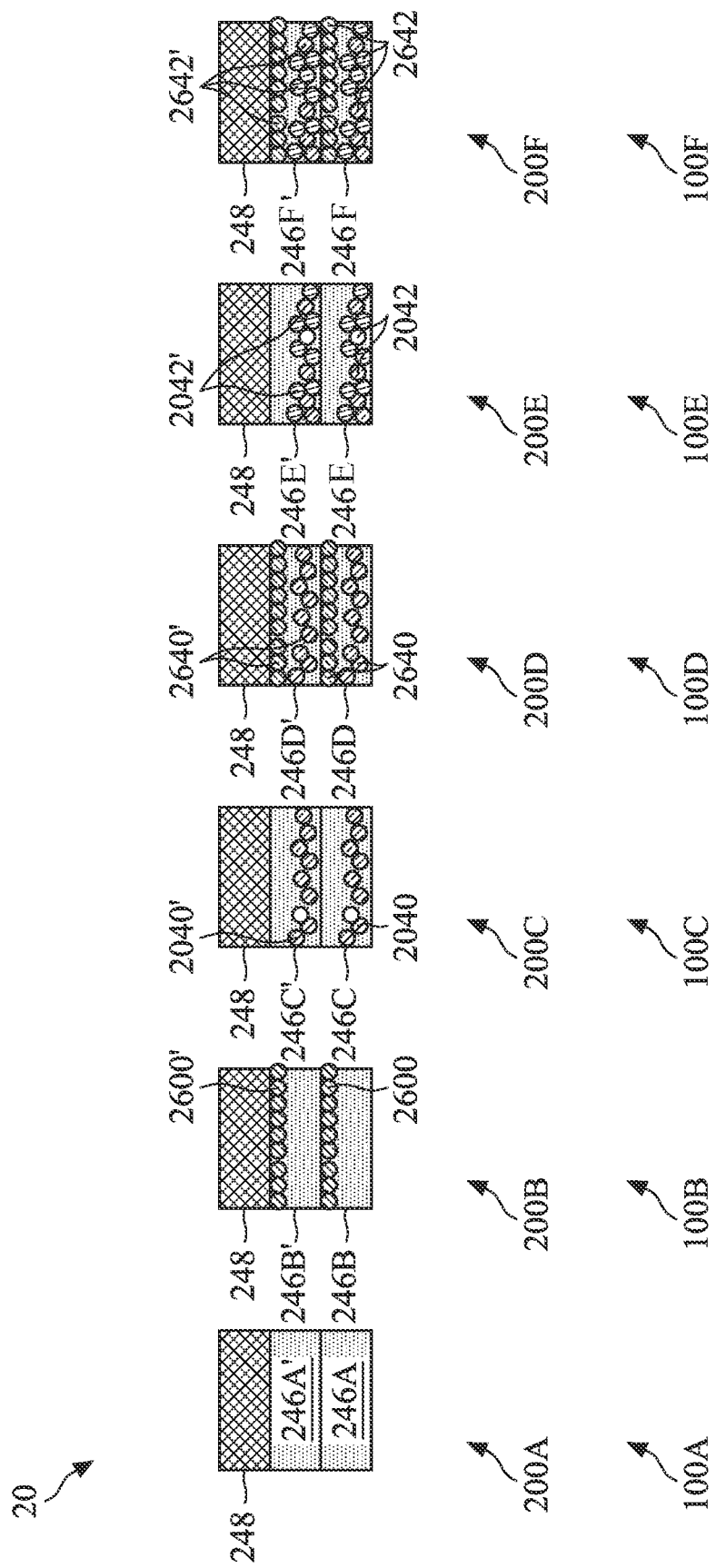

Referring to block 2080 of FIG. 14 and to FIG. 20, a process 506 is conducted to further adjust the location and/or distribution of the dipole materials within the gate dielectric portions 246A-246F. In some embodiments, the process 506 includes a thermal operation (or annealing operation). For example, the device 20 is annealed at a temperature of about 600° C. to about 1,000° C., such as about 700° C. to about 800° C., with $O_2$, $N_2$, or a mixture of $O_2$ and $N_2$ ambient. In another embodiment, the process 506 is a furnace anneal process at a temperature in a range from about 300° C. to about 600° C. with $O_2$, $N_2$, or a mixture of $O_2$ and $N_2$ ambient for about 1 second to about 30 minutes. In yet another embodiment, the process 506 is a spike anneal process. In still another embodiment, the process 506 is a laser anneal process or a microwave anneal process at a temperature in a range from about 800° C. to about 1,200° C. with $O_2$, $N_2$, $NH_3$, $H_2$, or a mixture thereof for about 1 millisecond to about 10 seconds. In some embodiments, the process 506 is configured to cause further migration of the dipole materials towards the channel layers 120. As described later, this may improve the effectiveness of threshold voltage tuning. In some embodiments, the process 506 may be configured to cause the dipole materials within the gate dielectric portions to be randomized and reach a normalized distribution (as opposed to a trailing distribution), such that the control of the threshold voltage may be improved. In some embodiments, although not specifically depicted, the process 506 is instead conducted between the process 502 and the process 504. In some embodiments, although not specifically depicted, the process 506 is conducted both between the process 502 and the process 504, as well as following the process 504. In some embodiments, the process 506 is omitted.

In some embodiments, additional dipole layers are formed over a subset of the gate dielectric portions, and additional thermal drive-in operations and etching operations are conducted to form transistors with additionally differentiated threshold voltages. In some embodiments, such additional dipole layers are omitted. Referring to branch "A" of FIG. 14, in some embodiments, the method 2000 proceeds to block 2090 to form the gate electrode layer. In other embodiments, referring to branch "B" of FIG. 14, the method 2000 proceeds back to the block 2030 to repeat the formation of another layer of gate dielectric layer 246'. In such embodiments, referring to FIG. 21, the additional gate dielectric layers 246' may be formed on top surfaces of the gate dielectric layer 246, similar to that described above with respect to device 10. Furthermore, referring to block 2090 of FIG. 14 and to FIG. 21, gate electrode layer 248 is formed on top surface of the gate dielectric layer 246' (or additional gate dielectric layers formed thereon). In some embodiments, the portions of the gate electrode layer 248 interfacing with the gate dielectric portions 246A-246F are identical, for example, having identical material compositions.

Referring to block 2100 of FIG. 14, the method 2000 proceeds to complete the fabrication of the device. For example, silicide features, contact features, via features, metal lines, passivation layers, among others may be formed.

Figure 22:
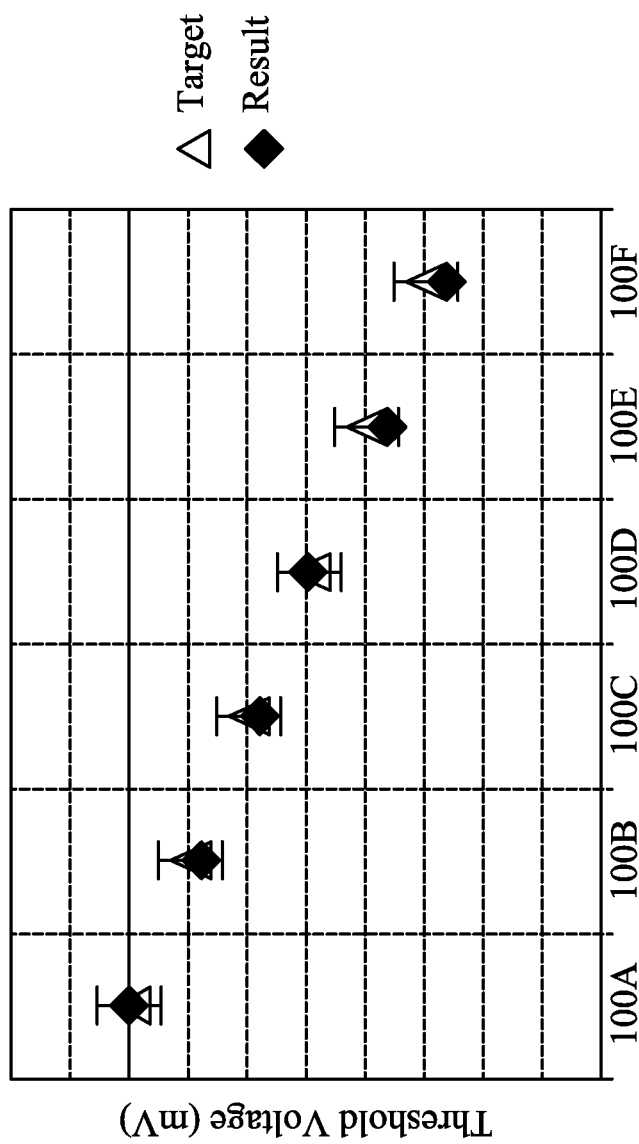

FIG. 22 shows a chart illustrating the Vt tuning capability according to an embodiment of the method. In this embodiment, transistors in a device (such as the device 20) are provided with 6 different threshold voltages. In this example, by incorporating dipole material 2600 in the transistor 100B, the threshold voltage is adjusted by −48 mV as compared to the transistor 100A without any dipole material. By incorporating dipole material composition 2040 in the transistor 100C, the threshold voltage is adjusted by −88 mV as compared to the transistor 100A. Moreover, by incorporating dipole material composition 2640 in the transistor 100D, the threshold voltage is adjusted by −121 mV as compared to the transistor 100A; by incorporating dipole material composition 2042 in the transistor 100E, the threshold voltage is adjusted by −174 mV as compared to the transistor 100A; and by incorporating dipole material composition 2642 in the transistor 100F, the threshold voltage is adjusted by −214 mV as compared to the transistor 100A.

Furthermore, these tuning capability matches well with the targeted values at −40 mV, −80 mV, −120 mV, −160 mV, and −200 mV respectively. In other words, by simply tuning the presence and/or configuration (e.g. chemical identity, concentration, and/or distribution) of the dipole materials in the gate dielectric layers, multi-Vt device may be reliably achieved with tuning capacity as large as −200 mV. Moreover, the channel resistance $R_{ch}$ for PMOS transistors by implementing the present disclosure, is reduced from about +0.2 kohm-fin to about 0.3 kohm-fin without implementing the methods provided herein to about +0.1 kohm-fin by implementing methods disclosed herein. As compared to some other approaches, the method provides good Vt linearity, comparable leakage current, and reduced channel resistance penalties, which all lead to device improvements.

Figure 23B:
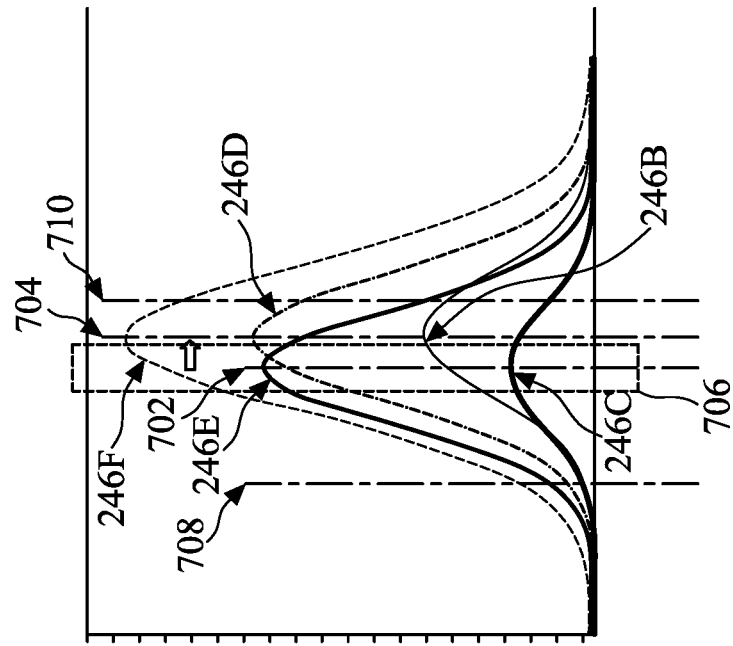
Figure 23A:
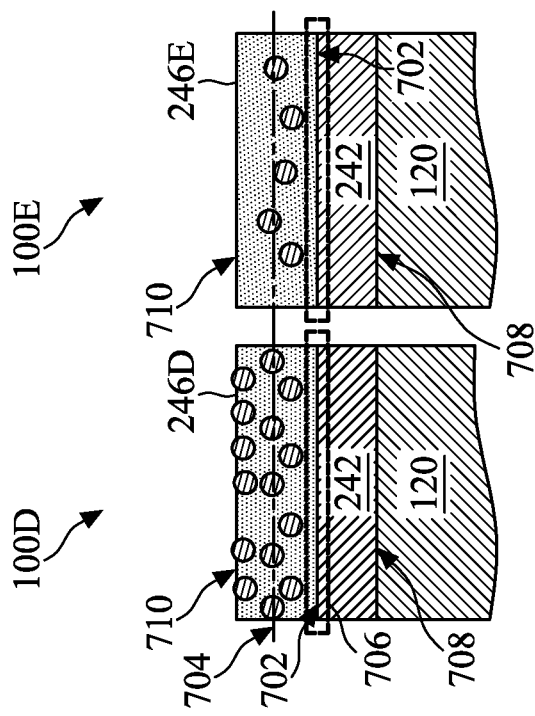
Figure 23C:
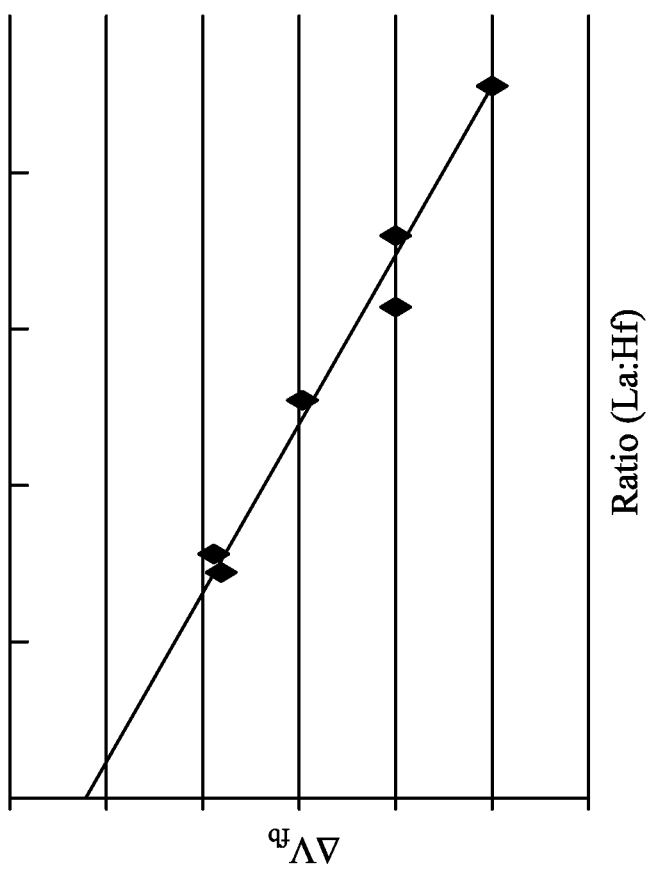
Figure 24:
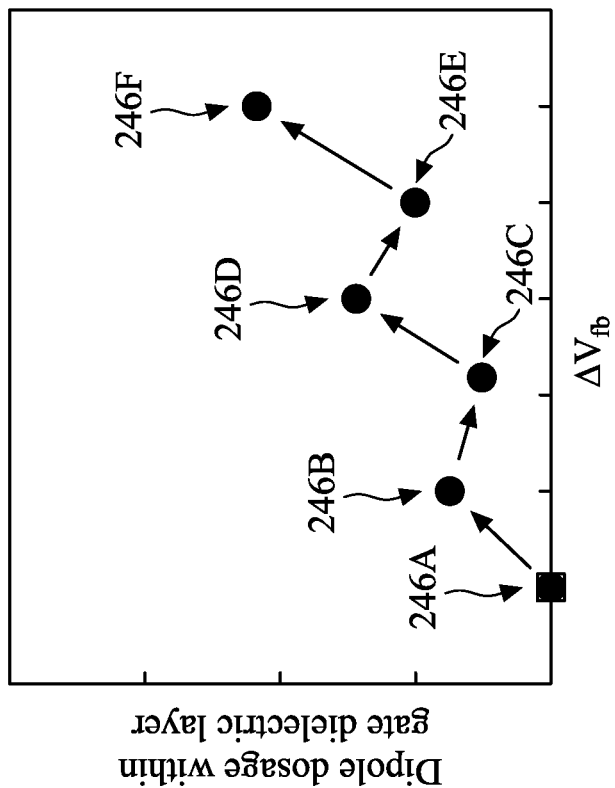

FIGS. 23A-23C offers more detail with regards to the diffusion and distribution of the dipole materials as results of the thermal drive-in operations 402A (of process 402) and 404A (of process 404), or 502A (of process 502) and 504A (of process 504). FIG. 23A is a schematic view of the distribution of the dipole materials in the gate dielectric layer 246. The line 702 depicts the interface between the gate dielectric layer 246 and the interfacial layer 242; the line 708 represents the interface between the interfacial layer 242 and the channel layer 120; the line 710 depicts the top surface of the gate dielectric layer 246 (which is also the interface between the gate dielectric layer and subsequently formed gate electrode layer 248); the line 704 represents the center line 704 (or half-thickness line 704) of the gate dielectric layer 246; and the region 706 depicts a region refers to the region having a thickness of about 1 nm to about 2 nm centering on the interface 702. In some embodiments, the dipole materials have dissimilar distributions in different transistors. For example, as seen in FIG. 23A, the dipole materials of transistor 100D has a wider distribution profile than the dipole materials of transistor 100E. Specifically, there may be a larger amount of dipole materials distributed close to the top surface 710 of the gate dielectric portion 246D than that of the gate dielectric portion 246E; and there may be a smaller amount of dipole materials distributed within the region 706 of the gate dielectric portion 246D than that of the gate dielectric portion 246E. FIG. 23B illustrates an example distribution of the dipole materials as a function of the location within the gate dielectric layer 246 and the interfacial layer 242, as well as other adjacent layers. FIG. 23B may have been simplified or conceptualized. The vertical axis of FIG. 23B represent the dosage of the dipole materials as measured. In some embodiments, these thermal drive-in operations are designed so that some of the dipole materials can migrate through the gate dielectric layer 246 and reach the interfacial layer 242. Moreover, although not explicitly depicted, in some embodiments, some dipole materials may further diffuse into the interfacial layer 242. For example, at least a portion of the dipole materials are distributed in the region 706. In some embodiments, having the dipole materials being close to the channel layer 120 allows greater tuning capability of the threshold voltage, even without increasing the amount of the dipole moment. However, having the dipole material too close to the channel layers may adversely affect other device characteristics. In some embodiments, dipole materials within the narrow region 706 has the maximum tuning efficacy of threshold voltages. In other words, threshold voltages are more sensitive to the dipole materials within the region 706 than to dipole materials outside the region 706. For example, referring to FIG. 23C, for a gate dielectric layer of $HfO_2$ doped with $La_2O_3$ of the present disclosure, a linear fit of a plot of the change in threshold voltage ($\Delta V_{fb}$) to the ratio of the lanthanum element to hafnium element at the interface line 702 provides a coefficient of determination ($R^2$) of about 0.98. Therefore, the threshold voltage responds not only to the chemical identities of the dipole materials, the concentrations of the dipole materials, as well as to the physical locations of the dipole materials in relationship to the interface 702. Leveraging this relationship, additional tuning ability are achieved. It is noted that the present disclosure further offers tighter control over the $\Delta V_{fb}$ as compared to other approaches not implementing disclosure herein. For example, a similar plot to that of FIG. 23C not implementing the methods described here provides an $R^2$ of less than 0.95.

Referring to FIGS. 23A-23C and 24, as described above, the parameters of the dipole layers 302, 304, and 306, as well as the parameters of the thermal drive-in operations 502A of process 502 and 504A of process 504 may be adjusted to control the location and distribution of the diffused dipole materials. In some embodiments, the materials of the dipole layers 302, 304, and 306 are identical to each other. According, the dipole materials 2600, 2040, 2640, 2042, and 2642 are also identical, although in varying amounts. In some embodiments, it is desired to configure the adjacent transistors to have alternating (rather than continuously rising or declining) dipole material concentrations. For example, referring to FIG. 24, it may be desirable to configure the concentration (or dosage) of the dipole materials to increase in the sequence of gate dielectric portions 246A<246C<246B<246E<246D<246F. In some embodiments, this configuration maximized processing efficiency and control precision. Meanwhile, it may be desirable to configure the threshold voltages of the adjacent transistors to change continuously (rather than alternatingly). In some embodiments, this allows easier adjusting and selection of the threshold voltages during operation. In other words, it may be desirable to configure the threshold voltage tuning capacity to increase in the sequence of gate dielectric portions 246A<246B<246C<246D<246E<246F. In some embodiments, this may be achieved by configuring distribution of the dipole materials in the gate dielectric portions 246B, 246D, and 246F to be different from those in the gate dielectric portions 246C and 246E. For example, specifically referring to FIG. 23B, the distribution of the dipole materials within the gate dielectric portions 246C and 246E are configured to peak (e.g. having the highest concentration) at or close to the interface line 702 (comparing the peak of the curve 246C/246E relative to the line 702). In some embodiments, the distribution of the dipole materials within the gate dielectric portions 246C and 246E are configured to peak within the region 706. Meanwhile, the distribution of the dipole materials within the gate dielectric portions 246B, 246D, and 246F are configured to peak at, or close to, the center line 704 (or half-thickness line 704) of the gate dielectric layer 246. Moreover, the distribution of the dipole materials within the gate dielectric portions 246A-246F are configured to have increasing concentrations at the interface line 702 according to the sequence 246A<246B<246C<246D<246E<246F. Accordingly, because the threshold voltage is most sensitive to the dipole materials within the region 706 around the interface line 702, the threshold voltage tuning capacity sequence is configured in the continuous fashion despite the overall concentration of the dipole material being configured in alternating fashion. In some embodiments, the above-described dipole material distribution is achieved by adopting a smaller layer thickness for dipole layer 306 than the dipole layer 304, which has a smaller layer thickness than the dipole layer 302, a lower anneal temperature (T2) for the thermal drive-in operation 504A than that of the thermal drive-in operation 502A (T1), or a longer anneal time duration (T2) for the thermal drive-in operation 504A than that of the thermal drive-in operation 502A (11), as described above. In some embodiments (not depicted), the concentration of the dipole material in the gate dielectric portion 246D is less than that in the gate dielectric portion 246E.

Figure 25A:
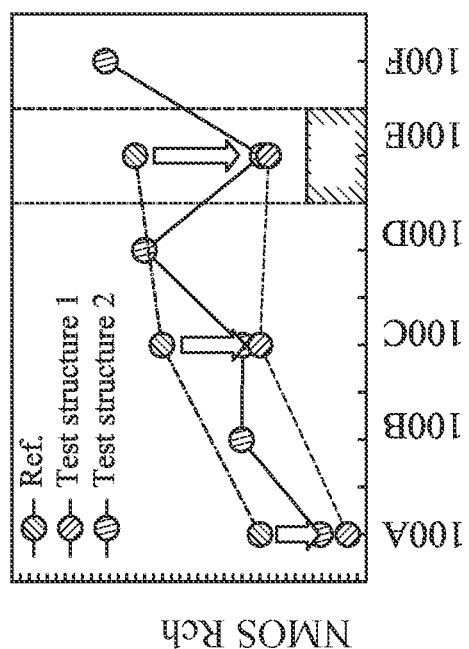
Figure 25B:
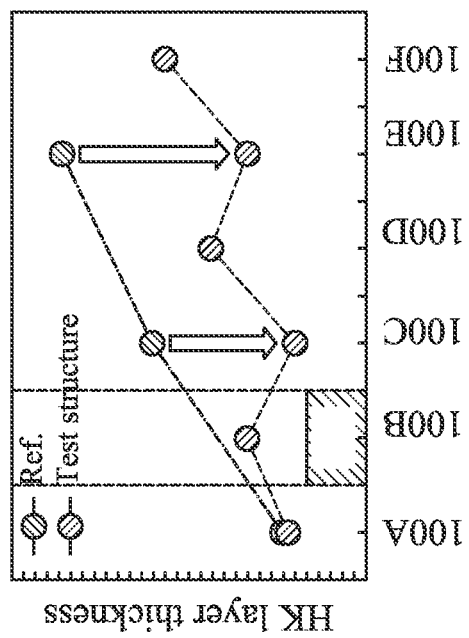

As described above, the etching operations 402B of process 402, 404B of process 404, 502B of process 502, and/or 504B of process 504 remove a portion of the relevant gate dielectric portions due to presence of the intermixing layers. FIG. 25A illustrates that following the etching operation 504B of process 504, which removes the remaining portions of dipole layer 306 on the gate dielectric portions 246B, 246D, and 246F, as well as the intermixing layer thereon, the thickness of the gate dielectric portions are significantly reduced as compared to other approaches not implementing the methods of the present disclosure. For example, as compared to other approaches, the thickness of the gate dielectric portions 246C and 246E are each reduced by about 1 Å to about 2 Å. The reduction in the gate dielectric portion thickness leads to reduction in the channel resistances $R_{ch}$. Referring to FIG. 25B, as compared to those other approaches, embodiments of the present disclosure provide reduced $R_{ch}$. For example, such reduction in the channel resistance of NMOS transistors may be about 0.1 kohm-fin to about 0.3 kohm-fin. Additionally, the reduced gate dielectric portions allow for greater processing window and easier fabrications.

Figure 26A:
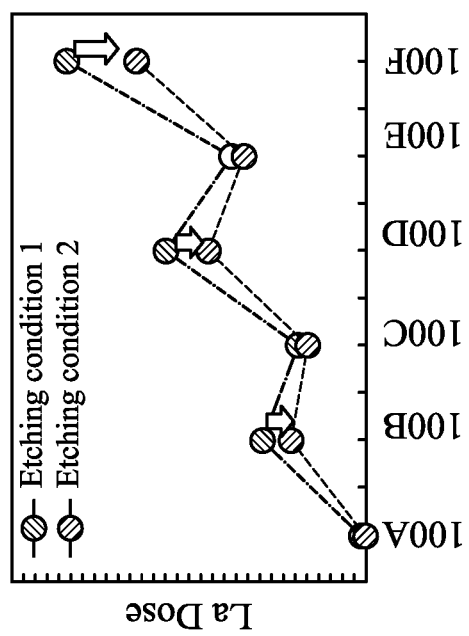
Figure 26B:
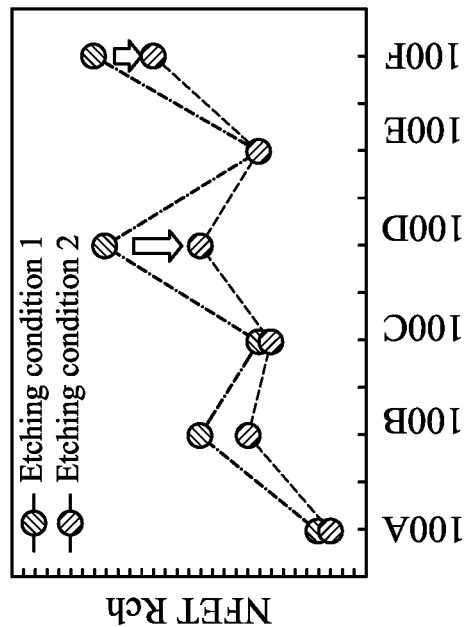

In some embodiments, the etching parameters (such as etching temperature, etching solution concentration, etching time, other suitable wet etching parameters, or combinations thereof) of the various etching operations (402B of process 402, 404B of process 404, 502B of process 502, and/or 504B of process 504) may be adjusted to provide different magnitude of thinning of the respective gate dielectric portions. FIGS. 26A and 26B illustrate an effect of etching time duration on the etching operation 504B of process 504 as an example. In the depicted example, the etching condition 1 implements an etching time duration of 105$s$; while the etching condition 2 implements an etching time duration of 210$s$. As illustrated, the etching condition 2 leads to further reduced La dosage. Moreover, the channel resistances of the transistors with etching condition 2 are further reduced by about 0.03 kohm-fin to about 0.1 kohm-fin, such as about 0.05 kohm-fin to about 0.08 kohm-fin as compared to the etching condition 1.

Although not intended to be limiting, one or more embodiments of the present disclosure provide many benefits to a semiconductor device and the formation thereof. For example, the present disclosure provides methods of using dipole materials to engineer the transistors with threshold voltage tuning capabilities, in some instances without additional gate electrode layers (or work function metal layers). A threshold voltage tuning range of about 180 mV to about 220 mV is reached. This represents an improvement over other approaches by about 100 mV to about 150 mV. Moreover, because any additional dipole materials are removed after the thermal drive-in operation, no additional volume or space is required as compared to other approaches. In other words, this may be referred to as a "volumeless" approach. In some embodiments, by using methods provided herein, the need of patterning work function metal layer(s) is obliviated, making it very suitable for nanosized transistors and enabling continued downscaling.

As compared to approaches that implement work function metals in adjusting threshold voltages, where the metals often remain in the finished devices, $R_{ch}$ penalty is improved. Moreover, in some embodiments, the large threshold voltage tuning capacity of the device 10 or 20 presented here allow fabricating of PMOS transistors with ultra-low threshold voltages, such as those conventionally only available with silicon germanium (SiGe) channel layers. Accordingly, in some embodiments, the present disclosure may be implemented in PMOS devices without SiGe channel layers, such as with Si channel layers alone. In some embodiments, the formation of SiGe channel layers require more complicated device processing. Accordingly, the present disclosure enables easier and more cost-effective fabrication of devices with similar threshold voltage tuning capabilities. In some other embodiments, the present disclosure may be implemented with the SiGe channel layers, so as to provide even greater threshold voltage tuning capacity. Furthermore, the present embodiments can be readily integrated into existing CMOS fabrication processes.

Methods 1000 and 2000 are merely examples and are not intended to limit the present disclosure to what is explicitly illustrated. For example, although the above disclosure describes the dielectric layers 246 being formed as part of the gate replacement process, in some alternative embodiments, the gate dielectric layers 246 may be formed at an earlier processing stage, e.g. prior to the formation of the dummy gate stacks. Additional steps may be provided before, during, or after methods 1000 or 2000, and some steps described can be replaced, eliminated, or moved around for additional embodiments of the method. Not all steps are described herein in detail for reasons of simplicity.

In one example aspect, the present disclosure is directed to a method. The method includes forming a dielectric layer on a semiconductor workpiece, forming a first patterned layer of a first dipole material on the dielectric layer, and performing a first thermal drive-in operation at a first temperature to form a diffusion feature in a first portion of the dielectric layer beneath the first patterned layer. The method also includes forming a second patterned layer of a second dipole material, where a first section of the second patterned layer is on the diffusion feature and a second section of the second patterned layer is offset from the diffusion feature. The method further includes performing a second thermal drive-in operation at a second temperature, where the second temperature is less than the first temperature. The method additionally includes forming a gate electrode layer on the dielectric layer.

In some embodiments, the first thermal drive-in operation is conducted for a first time duration, the second thermal drive-in operation is conducted for a second time duration, and the first time duration is less than the second time duration. In some embodiments, the first patterned layer has a first thickness, the second patterned layer has a second thickness, and the first thickness is greater than the second thickness. In some embodiments, the performing of the first thermal drive-in operation includes configuring the first thermal drive-in operation to form a first intermixing layer at an interface between the dielectric layer and first patterned layer. In some embodiments, the method further includes, after the performing of the first thermal drive-in operation, removing a remaining portion of the first patterned layer and the first intermixing layer. In some embodiments, the performing of the second thermal drive-in operation includes configuring the second thermal drive-in operation to form a second intermixing layer at an interface between the first section of second patterned layer and the dielectric layer, and a third intermixing layer at an interface between the second section of the second patterned layer and the dielectric layer. And the method further includes, after the performing of the second thermal drive-in operation, removing a remaining portion of the second patterned layer, the second intermixing layer, and the third intermixing layer. In some embodiments, the dielectric layer is a first dielectric layer, and the method further includes, after the performing of the second thermal drive-in operation, forming a second dielectric layer on the first dielectric layer, forming a third patterned layer of a third dipole material on the second dielectric layer, and performing a third thermal drive-in operation. In some embodiments, the forming of the first patterned layer includes forming a patterned sublayer covering a first region of the dielectric layer while exposing a second region of the dielectric layer, forming another sublayer on the patterned sublayer in the first region and on and interfacing with the dielectric layer in the second region, and collectively patterning the patterned sublayer and the another sublayer to expose the dielectric layer in a subset of the first region, thereby forming the first patterned layer. In some embodiments, the semiconductor workpiece includes a plurality of channel layers vertically stacked on a semiconductor substrate, and the dielectric layer is formed around the channel layers.

In one example aspect, the present disclosure is directed to a method. The method includes forming a dielectric layer on a semiconductor workpiece, forming a first patterned layer of a first dipole material on the dielectric layer, performing a first thermal drive-in operation for a first time duration, to drive a subset of the first dipole material into the dielectric layer, and performing a first etching operation to remove a remaining portion of the first dipole material. The method also includes forming a second patterned layer of a second dipole material on the dielectric layer, where a first portion of the second patterned layer is disposed on a first portion of the dielectric layer without the first dipole material and a second portion of the second patterned layer is disposed on a second portion of the dielectric layer with the first dipole material. The method further includes performing a second thermal drive-in operation for a second time duration, where the second time duration is greater than the first time duration. The method additionally includes performing a second etching operation to remove a remaining portion of the second dipole material, where the performing of the first etching operation includes recessing an intermixing region of the dielectric layer including the first dipole material.

In some embodiments, the method further includes forming a gate electrode layer on the dielectric layer, where the gate electrode layer and the dielectric layer surround a plurality of channel layers. In some embodiments, the performing of the second etching operation includes recessing an intermixing region of the dielectric layer that includes the second dipole material. In some embodiments, the performing of the second etching operation includes recessing an intermixing region of the dielectric layer that includes both the first dipole material and the second dipole material. In some embodiments, the performing of the first thermal drive-in operation includes performing at a first temperature, and the performing of the second thermal drive-in operation includes performing at a second temperature, and the first temperature is greater than the second temperature. In some embodiments, a difference between the first temperature and the second temperature is about 100° C. to about 200° C.

In one example aspect, the present disclosure is directed to a semiconductor device. The semiconductor device includes a semiconductor substrate, a first transistor on the semiconductor substrate and a second transistor on the semiconductor substrate. The first transistor includes a first channel, a first interfacial layer, a first gate dielectric layer on the first channel, and a first gate electrode layer on and interfacing with the first gate dielectric layer. The second transistor includes a second channel, a second interfacial layer, a second gate dielectric layer on the second channel, and a second gate electrode layer on and interfacing with the second gate dielectric layer. The first gate electrode layer and the second gate electrode layer have a same composition. The first gate dielectric layer includes a first dipole material composition that has a maximum concentration at a half-thickness line of the first gate dielectric layer. The second gate dielectric layer includes a second dipole material composition that has a maximum concentration at an interface between the second gate dielectric layer and the second interfacial layer.

In some embodiments, the dipole material includes one of germanium oxide ($GeO_2$), yttrium oxide ($Y_2O_3$), Lanthanum oxide ($La_2O_3$), strontium oxide (SrO), magnesium oxide (MgO), hafnium oxide ($HfO_2$), zirconium oxide ($ZrO_2$), titanium oxide ($TiO_2$), and aluminum oxide ($Al_2O_3$). In some embodiments, the second dipole material composition includes the first dipole material composition and a third dipole material composition. In some embodiments, the first channel is one of a first plurality of channels of the first transistor, and the second channel is one of a second plurality of channels of the second transistor. In some embodiments, the semiconductor device further includes a third transistor that has a third gate dielectric layer. The third gate dielectric layer is free of the first dipole material composition and free of the second dipole material composition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dielectric layer on a semiconductor workpiece;
    forming a first patterned layer of a first dipole material on the dielectric layer;
    performing a first thermal drive-in operation at a first temperature to form a diffusion feature in a first portion of the dielectric layer beneath the first patterned layer;
    forming a second patterned layer of a second dipole material, a first section of the second patterned layer being on the diffusion feature and a second section of the second patterned layer being offset from the diffusion feature;
    performing a second thermal drive-in operation at a second temperature, wherein the second temperature is less than the first temperature; and
    forming a gate electrode layer on the dielectric layer.

2. The method of claim 1, wherein the first thermal drive-in operation is conducted for a first time duration, the second thermal drive-in operation is conducted for a second time duration, and the first time duration is less than the second time duration.

3. The method of claim 1, wherein the first patterned layer has a first thickness, and the second patterned layer has a second thickness, and the first thickness is greater than the second thickness.

4. The method of claim 1, wherein the performing of the first thermal drive-in operation includes configuring the first thermal drive-in operation to form a first intermixing layer at an interface between the dielectric layer and first patterned layer.

5. The method of claim 4, wherein the performing of the first thermal drive-in operation forms a remaining portion of the first patterned layer, and
wherein the method further comprises, after the performing of the first thermal drive-in operation, removing the remaining portion of the first patterned layer and the first intermixing layer.

6. The method of claim 1, wherein the performing of the second thermal drive-in operation includes configuring the second thermal drive-in operation to form a second intermixing layer at an interface between the first section of second patterned layer and the dielectric layer, and a third intermixing layer at an interface between the second section of the second patterned layer and the dielectric layer,
wherein the performing of the second thermal drive-in operation forms a remaining portion of the second patterned layer, and
the method further comprising, after the performing of the second thermal drive-in operation, removing the remaining portion of the second patterned layer, the second intermixing layer, and the third intermixing layer.

7. The method of claim 1, wherein the dielectric layer is a first dielectric layer, the method further comprising:
after the performing of the second thermal drive-in operation, forming a second dielectric layer on the first dielectric layer;
forming a third patterned dipole layer on the second dielectric layer; and
performing a third thermal drive-in operation.

8. The method of claim 1, wherein the forming of the first patterned layer includes:
forming a patterned sublayer covering a first region of the dielectric layer while exposing a second region of the dielectric layer;
forming another sublayer on the patterned sublayer in the first region and on and interfacing with the dielectric layer in the second region; and
collectively patterning the patterned sublayer and the another sublayer to expose the dielectric layer in a subset of the first region, thereby forming the first patterned layer.

9. The method of claim 1, wherein the semiconductor workpiece includes a plurality of channel layers vertically stacked on a semiconductor substrate, and wherein the dielectric layer is formed around the channel layers.

10. A method, comprising:
forming a dielectric layer on a semiconductor workpiece;
forming a first patterned layer of a first dipole material on the dielectric layer;
performing a first thermal drive-in operation for a first time duration to drive a subset of the first dipole material into the dielectric layer, thereby forming a remaining portion of the first dipole material and a first intermixing region of the dielectric layer including the first dipole material;
performing a first etching operation to remove the remaining portion of the first dipole material;
forming a second patterned layer of a second dipole material on the dielectric layer, a first portion of the second patterned layer being disposed on a first portion of the dielectric layer without the first dipole material and a second portion of the second patterned layer being disposed on a second portion of the dielectric layer with the first dipole material;
performing a second thermal drive-in operation for a second time duration, thereby forming a remaining portion of the second dipole material, wherein the second time duration is greater than the first time duration; and
performing a second etching operation to remove the remaining portion of the first second dipole material,
wherein the performing of the first etching operation includes recessing the first intermixing region of the dielectric layer including the first dipole material.

11. The method of claim 10, further comprising forming a gate electrode layer on the dielectric layer, wherein the gate electrode layer and the dielectric layer surround a plurality of channel layers.

12. The method of claim 10, wherein the performing of the second thermal drive-in operation forms a second intermixing region of the dielectric layer that includes the second dipole material, and
wherein the performing of the second etching operation includes recessing the second intermixing region of the dielectric layer that includes the second dipole material.

13. The method of claim 10, wherein the performing of the first thermal drive-in operation includes performing at a first temperature, and the performing of the second thermal drive-in operation includes performing at a second temperature, and wherein the first temperature is greater than the second temperature.

14. The method of claim 13, wherein a difference between the first temperature and the second temperature is about 100° C. to about 200° C.

15. A semiconductor device, comprising:
a semiconductor substrate;
a first transistor on the semiconductor substrate having a first channel, a first interfacial layer, a first gate dielectric layer on the first channel, and a first gate electrode layer on and interfacing with the first gate dielectric layer; and
a second transistor on the semiconductor substrate having a second channel, a second interfacial layer, a second gate dielectric layer on the second channel, and a second gate electrode layer on and interfacing with the second gate dielectric layer,
wherein the first gate electrode layer and the second gate electrode layer have a same composition,
wherein the first gate dielectric layer includes a first dipole material composition having a maximum concentration at a half-thickness line of the first gate dielectric layer, and
wherein the second gate dielectric layer includes a second dipole material composition having a maximum concentration at an interface between the second gate dielectric layer and the second interfacial layer.

16. The semiconductor device of claim 15, wherein the first dipole material composition and the second dipole material composition each includes one of germanium oxide (GeO$_2$), yttrium oxide (Y$_2$O$_3$), Lanthanum oxide (La$_2$O$_3$), strontium oxide (SrO), magnesium oxide (MgO), hafnium (HfO$_2$), zirconium oxide (ZrO$_2$), titanium oxide (TiO$_2$), and aluminum oxide (Al$_2$O$_3$).

17. The semiconductor device of claim 15, wherein the second dipole material composition includes the first dipole material composition and a third dipole material composition.

18. The semiconductor device of claim 15, wherein the first channel is one of a first plurality of channels of the first transistor, and the second channel is one of a second plurality of channels of the second transistor.

19. The semiconductor device of claim 15, further comprising a third transistor having a third gate dielectric layer, wherein the third gate dielectric layer being free of the first dipole material composition and free of the second dipole material composition.

20. The method of claim 10, wherein the dielectric layer is a first dielectric layer, the method further comprising:
- after the performing of the second thermal drive-in operation, forming a second dielectric layer on the first dielectric layer;
- forming a third patterned dipole layer on the second dielectric layer; and
- performing a third thermal drive-in operation.

* * * * *